(12) United States Patent
Shimizu et al.

(10) Patent No.: US 9,786,740 B2
(45) Date of Patent: *Oct. 10, 2017

(54) SEMICONDUCTOR DEVICE AND METHOD FOR PRODUCING THE SAME

(71) Applicant: Kabushiki Kaisha Toshiba, Minato-ku (JP)

(72) Inventors: Tatsuo Shimizu, Shinagawa (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/619,631

(22) Filed: Feb. 11, 2015

(65) Prior Publication Data

US 2015/0270353 A1    Sep. 24, 2015

(30) Foreign Application Priority Data

Mar. 20, 2014  (JP) ................................. 2014-059198

(51) Int. Cl.
*H01L 31/0312* (2006.01)
*H01L 29/16* (2006.01)
(Continued)

(52) U.S. Cl.
CPC ........ *H01L 29/1608* (2013.01); *H01L 21/046* (2013.01); *H01L 21/0455* (2013.01); *H01L 21/0485* (2013.01); *H01L 21/0495* (2013.01); *H01L 21/26506* (2013.01); *H01L 29/167* (2013.01); *H01L 29/36* (2013.01); *H01L 29/4236* (2013.01); *H01L 29/47* (2013.01); *H01L 29/6606* (2013.01); *H01L 29/7806* (2013.01); *H01L 29/7813* (2013.01); (Continued)

(58) Field of Classification Search
CPC .................... H01L 29/1608; H01L 21/0455
See application file for complete search history.

(56) References Cited

U.S. PATENT DOCUMENTS

| | | | |
|---|---|---|---|
| 5,322,802 A | 6/1994 | Baliga et al. | |
| 5,338,945 A | 8/1994 | Baliga et al. | |

(Continued)

FOREIGN PATENT DOCUMENTS

| | | |
|---|---|---|
| EP | 1 883 102 A2 | 1/2008 |
| JP | 3361061 | 1/2003 |

(Continued)

OTHER PUBLICATIONS

Tatsuya Morine, et al., "Characterization of Mg-Implanted 4H-SiC layers", The 60th JSAP Spring Meeting, 28p-G22-11, 2013, 1 page.

(Continued)

*Primary Examiner* — Jerome Jackson, Jr.
(74) *Attorney, Agent, or Firm* — Oblon, McClelland, Maier & Neustadt, L.L.P.

(57) ABSTRACT

A semiconductor device of according to an embodiment of the present disclosure includes a n-type SiC layer; a SiC region provided on the n-type SiC layer and containing H (hydrogen) or D (deuterium) in an amount of $1 \times 10^{18}$ cm$^{-3}$ or more and $1 \times 10^{22}$ cm$^{-3}$ or less; and a metal layer provided on the SiC region.

19 Claims, 20 Drawing Sheets

(51) Int. Cl.
- *H01L 21/04* (2006.01)
- *H01L 29/47* (2006.01)
- *H01L 29/167* (2006.01)
- *H01L 29/66* (2006.01)
- *H01L 29/78* (2006.01)
- *H01L 29/872* (2006.01)
- *H01L 21/265* (2006.01)
- *H01L 29/36* (2006.01)
- *H01L 29/423* (2006.01)
- *H01L 29/45* (2006.01)
- *H01L 29/417* (2006.01)
- *H01L 29/06* (2006.01)

(52) U.S. Cl.
CPC ........ *H01L 29/872* (2013.01); *H01L 29/0657* (2013.01); *H01L 29/41766* (2013.01); *H01L 29/45* (2013.01)

(56) References Cited

U.S. PATENT DOCUMENTS

| | | | |
|---|---|---|---|
| 6,221,700 | B1 | 4/2001 | Okuno et al. |
| 2003/0080384 | A1* | 5/2003 | Takahashi ............... C30B 25/02 257/347 |
| 2005/0077591 | A1 | 4/2005 | Fukuda et al. |
| 2008/0026544 | A1 | 1/2008 | Tsuchida et al. |
| 2009/0039358 | A1 | 2/2009 | Tsuchida et al. |
| 2009/0047772 | A1 | 2/2009 | Tsuchida et al. |
| 2009/0072244 | A1 | 3/2009 | Harada et al. |
| 2010/0173475 | A1 | 7/2010 | Tsuchida et al. |
| 2015/0270354 | A1 | 9/2015 | Shimizu et al. |

FOREIGN PATENT DOCUMENTS

| | | |
|---|---|---|
| JP | 2005-079339 A | 3/2005 |
| JP | 2006-352014 | 12/2006 |
| JP | 2007-242744 A | 9/2007 |
| JP | 4029466 | 1/2008 |
| JP | 2008-72146 A | 3/2008 |
| JP | 2015-185616 A | 10/2015 |

OTHER PUBLICATIONS

Hideharu Matsuura, et al., "Electrical Properties of Mg-Implanted 4H-SiC", Materials Science Forum, vols. 778-780, 2014, pp. 685-688.

Partial European Search Report issued Aug. 3, 2015 in Patent Application No. 15153827.9.

A. Shiryaev, et al., "Deuteron implantation into hexagonal silicon carbide: defects and deuterium behaviour", The European Physical Journal Applied Physics, XP 55197685A, vol. 23, No. 1, Jun. 2003, pp. 11-18.

Extended European Search Report issued on Oct. 30, 2015 in Patent Application No. 15153827.9.

U.S. Appl. No. 14/641,775, filed Mar. 9, 2015, Shimizu, et al.

* cited by examiner

Ar ANNEALING

H₂ ANNEALING

SEMICONDUCTOR DEVICE AND METHOD FOR PRODUCING THE SAME

CROSS-REFERENCE TO RELATED APPLICATION

This application is based upon and claims the benefit of priority from Japanese Patent Application No. 2014-059198, filed on Mar. 20, 2014, the entire contents of which are incorporated herein by reference.

FIELD

Embodiments described herein relate generally to a semiconductor device and a method for producing the same.

BACKGROUND

SiC (silicon carbide) is expected to be a next-generation material for semiconductor devices. SiC has excellent physical properties with the band gap being threefold, the breakdown electric field strength being about tenfold and the thermal conductivity being about threefold as compared to Si (silicon). By taking advantage of these properties, a semiconductor device, which has a high breakdown voltage and a low loss and is capable of being operated at a high temperature, can be provided.

Semiconductor rectifying devices are classified roughly into PIN diodes using a p-n junction between a p-type semiconductor and a n-type semiconductor, and Schottky barrier diodes (SBD) using a Schottky junction between a semiconductor and a metal. The Schottky barrier diode is a unipolar device having only majority carriers as carriers, and is therefore suitable for operations in a high frequency range as compared to the PIN diode.

A device structure has been proposed in which a leak current at the off-time is reduced by depleting a drift layer using a Schottky barrier height of a Schottky barrier diode. For increasing the width of the depletion layer, it is required to form a high barrier between a semiconductor and a metal.

DETAILED DESCRIPTION

A semiconductor device of an embodiment includes a n-type SiC layer; a SiC region provided on the n-type SiC layer and containing H (hydrogen) or D (deuterium) in an amount of $1 \times 10^{18}$ cm$^{-3}$ or more and $1 \times 10^{22}$ cm$^{-3}$ or less; and a metal layer provided on the SiC region.

Embodiments of the present disclosure will be described below with reference to the drawings. In the descriptions below, the same members etc. are given the same symbols, and explanations of once described members etc. are appropriately omitted.

In the descriptions below, the notations of n$^+$, n and n$^-$ and p$^+$, p and p$^-$ each denote a relative level of impurity concentration in each conductivity type. That is, n$^+$ means that the conductivity type has a relatively high n-type impurity concentration as compared to n, and n$^-$ means that the conductivity type has a relatively low n-type impurity concentration as compared to n. Further, p$^+$ means that the conductivity type has a relatively high p-type impurity concentration as compared to p, and p$^-$ means that the conductivity type has a relatively low p-type impurity concentration as compared to p. "n$^+$-type" and "n$^-$-type" may each be simply described as "n-type", and "p$^+$-type" and "p$^-$-type" may be simply described as "p-type".

First Embodiment

A semiconductor device of this embodiment includes a n-type SiC layer; a SiC region provided on the n-type SiC layer and containing H (hydrogen) or D (deuterium) in an amount of $1 \times 10^{18}$ cm$^{-3}$ or more and $1 \times 10^{22}$ cm$^{-3}$ or less; and a metal layer provided on the SiC region.

Figure 1:
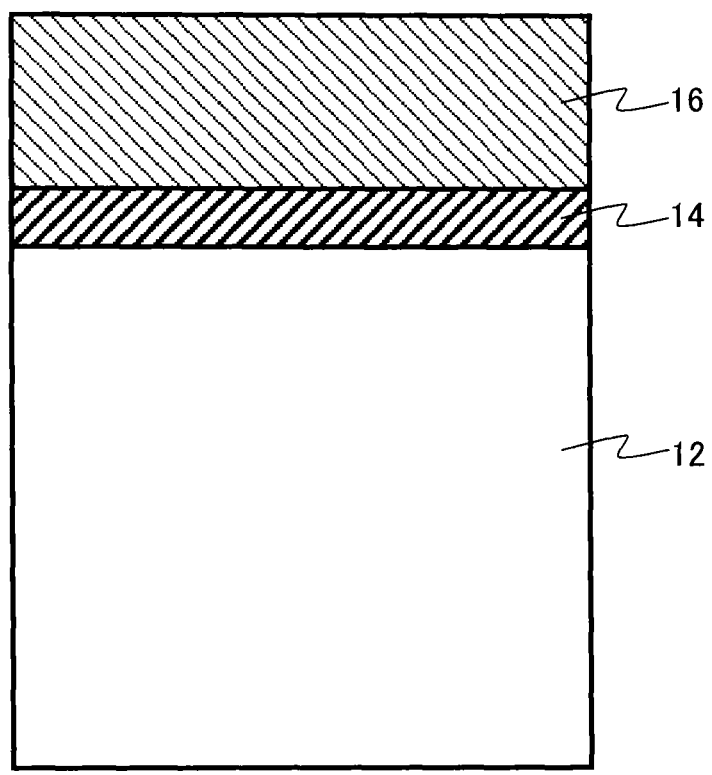
FIG. 1 is a schematic sectional view of a semiconductor device of a first embodiment.

FIG. 1 is a schematic sectional view of the semiconductor device of this embodiment. FIG. 1 shows a contact structure between a n-type SiC semiconductor and a metal. A SiC layer 14 is provided on a n-type SiC layer 12, and a metal layer 16 is provided on the SiC region 14.

For example, the n-type SiC layer 12 is 4H—SiC having an impurity concentration of $1\times10^{15}$ cm$^{-3}$ or more and $1\times10^{18}$ cm$^{-3}$ or less and containing, for example, N (nitrogen) as a n-type impurity. For example, the n-type SiC layer 12 has a main surface having an off angle of 0 degree or more and 8 degrees or less with respect to the plane.

The SiC region 14 contains H (hydrogen) or D (deuterium) (hereinafter, H (hydrogen) or D (deuterium) is also referred to simply as "hydrogen" as a concept including deuterium that is an isotope of hydrogen) in an amount of $1\times10^{18}$ cm$^{-3}$ or more and $1\times10^{22}$ cm$^{-3}$ or less. The content of hydrogen in SiC region can be measured by, for example, SIMS (secondary ion mass spectrometry). The content of hydrogen is, for example, $1\times10^{12}$ cm$^{-2}$ or more and $1\times10^{16}$ cm$^{-2}$ or less in terms of a surface density.

The SiC region 14 is metal. That is, it is metallized SiC. The work function of the SiC region 14 is desirable to be 6.0 eV or more from the viewpoint of ensuring that the contact between the n-type SiC layer 12 and the metal layer 16 is made to be a Schottky contact having a high barrier.

Hydrogen in the SiC region 14 is positioned at the Si (silicon) site of SiC structure. For example, 80% or more of hydrogen in the SiC region 14 is positioned at the Si (silicon) site of SiC structure. Whether or not hydrogen in the SiC region 14 is positioned at the Si (silicon) site of SiC structure can be determined by measurement by, for example, XPS (X-ray photoelectron spectroscopy).

The film thickness of the SiC region 14 is, for example, 1 nm or more and 1 μm or less.

The material that forms the metal layer 16 is not particularly limited. Examples of the material that forms the metal layer 16 include TiN (titanium nitride), W (tungsten), polycrystalline silicon, Al (aluminum), Ti (titanium), Cu (copper), Ni (nickel), Pt (platinum) and Au (gold).

The function and effect of this embodiment will be described below.

As a result of studies from first principle calculation by the present inventors, it has become evident that when H (hydrogen) enters the site of Si (silicon) of SiC structure, SiC is metallized. Further, according to first principle calculation, it has become evident that the work function is almost equal to 6.86 eV, a potential energy measured from the vacuum state at the upper end of the valence band of SiC. Specifically, the work function is 6.0 eV or more, for example 6.23 eV.

FIGS. 2A, 2B, 3A and 3B are views for explaining the function of the semiconductor device of this embodiment.

Figure 2A:
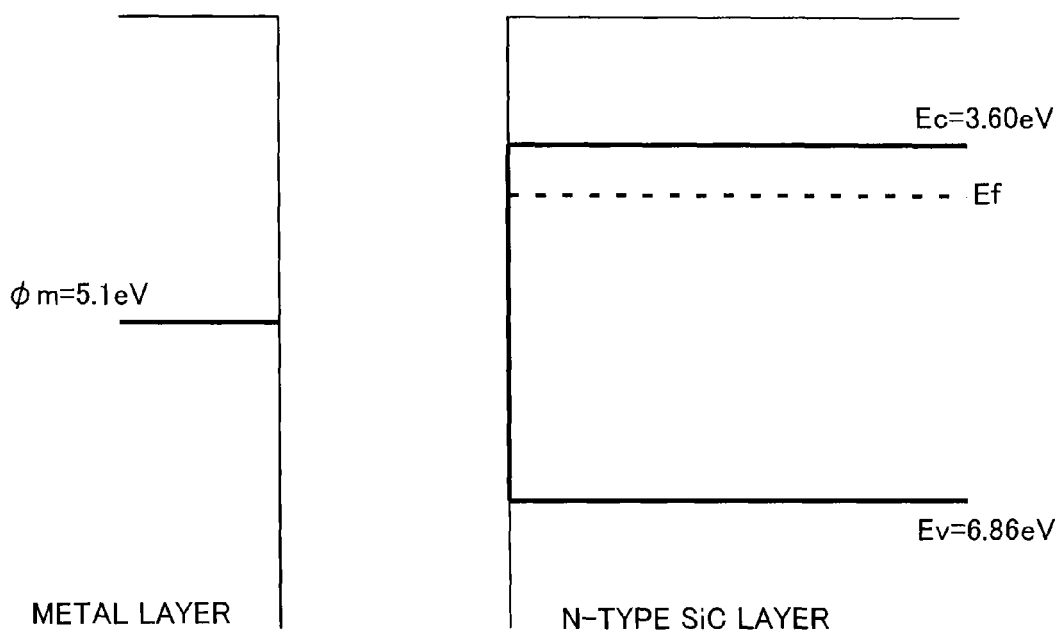
FIGS. 2A and 2B are views for explaining the function of the semiconductor device of the first embodiment.
Figure 2B:
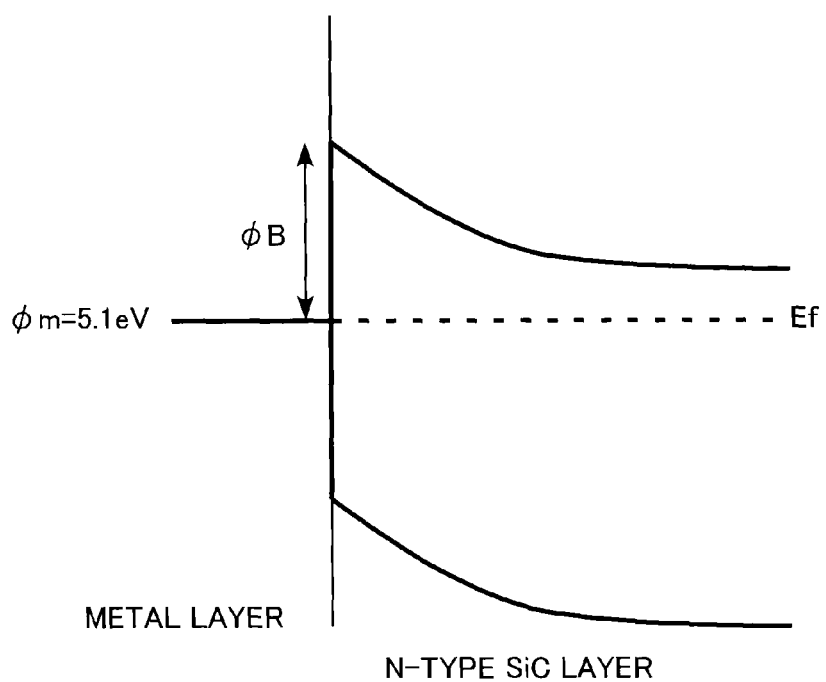
Figure 3A:
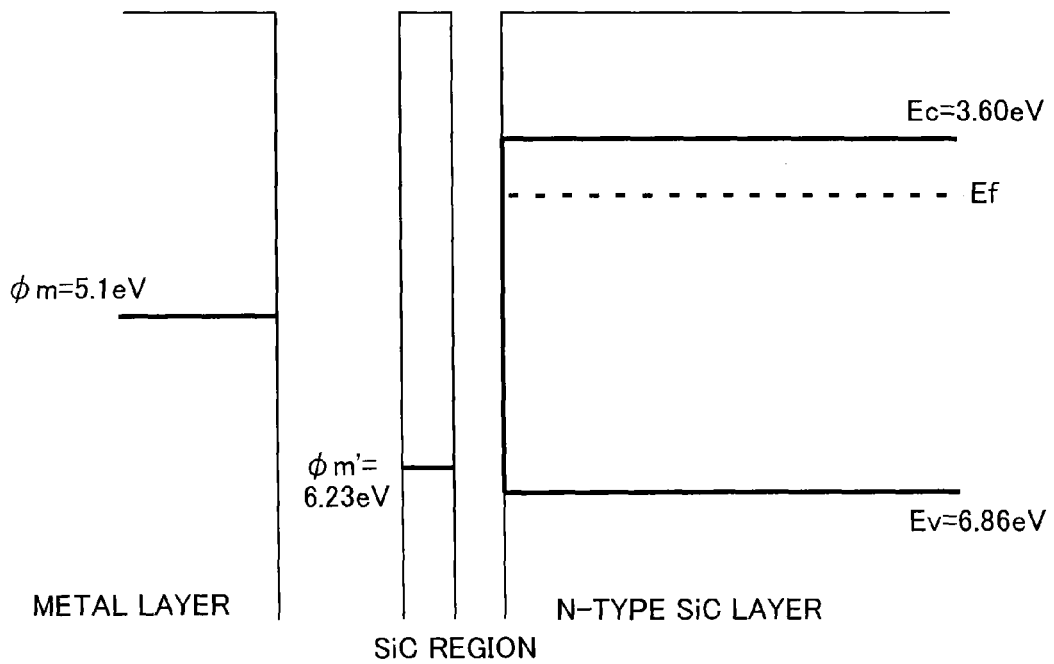
FIGS. 3A and 3B are views for explaining the function of the semiconductor device of the first embodiment.
Figure 3B:
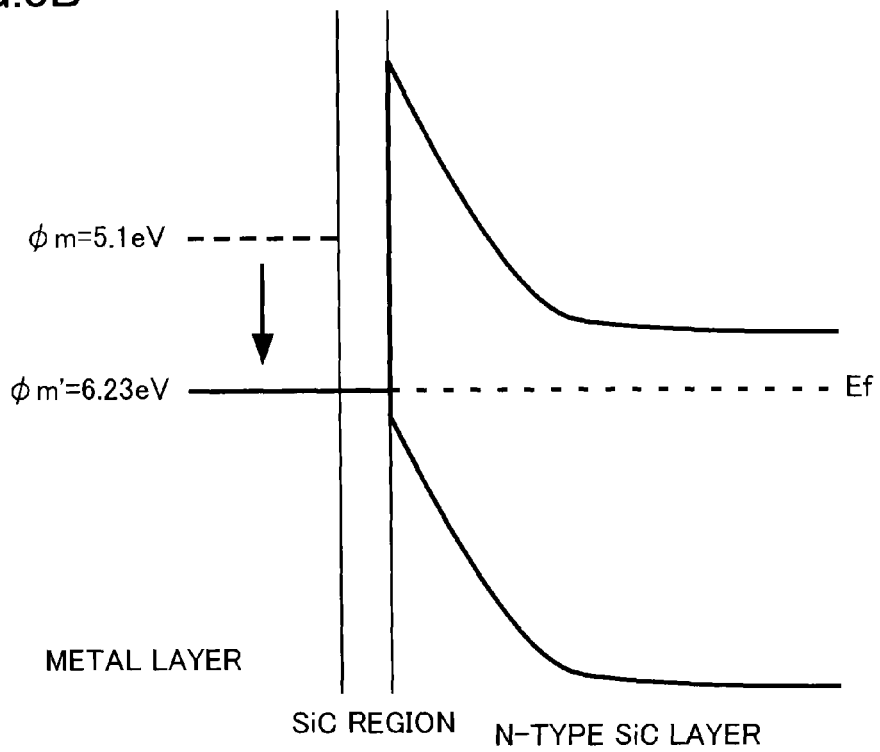

FIGS. 2A and 2B are band diagrams of a contact between the n-type SiC layer 12 and the metal layer 16 when the SiC region 14 is absent. FIGS. 3A and 3B are band diagrams of a contact between the p-type SiC layer 12 and the metal layer 16 when the SiC region 14 is present. FIGS. 2A and 3A are band diagrams before the n-type SiC layer 12 and the metal layer 16 come into contact with each other, and FIGS. 2B and 3B are band diagrams after the n-type SiC layer 12 and the metal layer 16 come into contact with each other.

In all of FIGS. 2A, 2B, 3A and 3B, a metal having a work function (φm) in the vicinity of a mid gap of SiC is assumed as the metal layer 16. Specifically, the metal is Ni (nickel) having a work function (φm) of 5.1 eV.

As shown in FIG. 2A, the n-type SiC layer 12 has a potential energy (Ev) of 6.86 eV at the upper end of the valence band and a potential energy (Ec) of 3.60 eV at the lower end of conduction band. In the n-type SiC layer 12, the fermi level (Ef) is at a position close to the lower end of the conduction band.

As shown in FIG. 2B, when the n-type SiC layer 12 and the metal layer 16 come into contact with each other, the contact between the n-type SiC layer 12 and the metal layer 16 becomes a Schottky contact in which a Schottky barrier (φB) exists.

Among metal materials applicable in the semiconductor process, there is no suitable material having a work function close to a work function in the vicinity of a potential energy (Ev) at the upper end of the valence band of SiC. Therefore, it is difficult for the contact between the n-type SiC layer 12 and the metal layer 16 to be a Schottky contact having a high barrier.

As shown in FIG. 3A, the metallic SiC region 14 in this embodiment has a work function (φm') in the vicinity of a potential energy (Ev) at the upper end of the valence band of SiC. Specifically, the work function is 6.0 eV or more, and for example, φm' is 6.23 eV.

FIG. 3B shows a case where the n-type SiC layer 12 and the metal layer 16 are in contact with each other with the SiC region 14 interposed therebetween. In this case, there is a high Schottky barrier between the n-type SiC layer 12 and the SiC region 14. Between the SiC region 14 and the metal layer 16, the SiC region 14 serves as a pinning site, so that the work function of the metal layer 16 increases to apparently 6.23 eV. Therefore, the barrier between the n-type SiC layer 12 and the metal layer 16 becomes extremely high, so that the contact between the n-type SiC layer 12 and the metal layer 16 can be made to be a Schottky contact having a high barrier.

According to the semiconductor device of this embodiment, the SiC region 14 having a work function in the vicinity of the upper end of the valence band in the n-type SiC layer 12 serves as a pinning site to provide a Schottky contact having a high barrier between the n-type SiC layer 12 and the metal layer 16. At this time, the Schottky barrier no longer depends on a work function of the material that forms the metal layer 16. Therefore, in formation of a contact structure between the n-type SiC layer 12 and the metal layer 16, an optimum material can be selected not in consideration of the height of the Schottky barrier but from the viewpoint of other device properties or a production process.

As described above, the SiC region 14 contains H (hydrogen) or D (deuterium) in an amount of $1\times10^{18}$ cm$^{-3}$ or more and $1\times10^{22}$ cm$^{-3}$ or less in terms of a volume density. The content of H (hydrogen) or D (deuterium) in the SiC region 14 is desirable to be $1\times10^{19}$ cm$^{-3}$ or more and $1\times10^{21}$ cm$^{-3}$ or less. The content of hydrogen is desirable to be, for example, $1\times10^{13}$ cm$^{-2}$ or more and $1\times10^{15}$ cm$^{-2}$ or less in terms of a surface density. When the content of hydrogen falls below the above-mentioned range, metallization may be insufficient. When the content of hydrogen falls above the above-mentioned range, strain of crystals may increase.

The film thickness of the SiC region 14 is desirable to be, for example, 1 nm or more and 1 μm or less, and desirable to be 2 nm or more and 500 nm or less. When the film thickness of the SiC region 14 falls below the above-mentioned range, the pinning effect may be insufficient. When the film thickness of the SiC region 14 falls above the above-mentioned range, it may be difficult to secure stability in terms of a production process.

In this embodiment, the resistance between the SiC region 14 and the metal layer 16 is low without depending on a work function of the material that forms the metal layer 16.

In the case of a contact between a p-type SiC layer and a metal layer with the SiC region 14 interposed therebetween unlike this embodiment, the barrier between the p-type SiC layer and the metal layer becomes extremely small, so that the contact between the p-type SiC layer and the metal layer can be made to be an ohmic contact irrespective of the work function of the metal layer.

A first method for producing a semiconductor device according to this embodiment will now be described. FIGS. 4A to 4E are schematic sectional views of the semiconductor device in the process of production in the first method for producing a semiconductor device according to this embodiment.

The first method for producing a semiconductor device according to this embodiment includes ion-implanting H (hydrogen), or D (deuterium) and C (carbon) into a n-type SiC layer, performing a first heat treatment after the ion implantation of H (hydrogen) and C (carbon), and forming a metal layer on the SiC layer after the first heat treatment.

First, the n-type SiC layer 12 is provided (FIG. 4A) For example, the n-type SiC layer 12 is 4H—SiC having an impurity concentration of $1\times10^{15}$ cm$^{-3}$ or more and $1\times10^{18}$ cm$^{-3}$ or less and containing, for example, N (nitrogen) as a n-type impurity. For example, the n-type SiC layer 12 has a main surface having an off angle of 0 degree or more and 8 degrees or less with respect to the plane.

Figure 4A:
FIGS. 4A to 4E are schematic sectional views of the semiconductor device in the process of production in a first production method in the first embodiment.
Figure 4B:
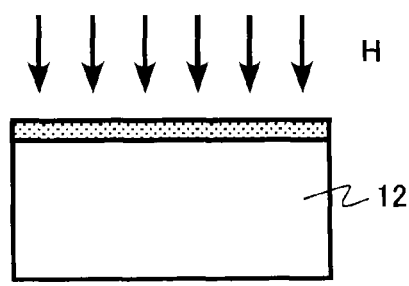

Next, H (hydrogen) or D (deuterium) is ion-implanted into the n-type SiC layer 12 (FIG. 4B). The dose amount of H (hydrogen) or D (deuterium) is, for example, $1\times10^{12}$ cm$^{-2}$ or more and $1\times10^{16}$ cm$^{-2}$ or less.

Figure 4C:
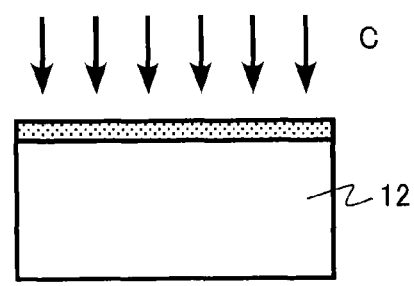

Next, C (carbon) is ion-implanted into the n-type SiC layer 12 (FIG. 4C). The ion implantation is performed for generating defects of Si (silicon) in the n-type SiC layer 12, and causing C (carbon) to exist in an excessive amount, so that H (hydrogen) or D (deuterium) to be introduced into the n-type SiC layer 12 easily enters the site of Si (silicon) of SiC structure.

Figure 4D:

Next, high-temperature annealing (first heat treatment) for activating H (hydrogen) or D (deuterium) is performed (FIG. 4D). For example, high-temperature annealing is performed under conditions of a heating temperature of 400° C. or higher and 1600° C. or lower and a heating time of 10 minutes or more and 60 minutes of less using a mixed atmosphere of a hydrogen gas and an argon (Ar) gas. For example, the heating temperature is 900° C. Here, as an inert gas, Ar is used, but a $N_2$ gas, a He gas, a Ne gas or the like may be used. Particularly, the He gas has a small element radius, and therefore has an effect of preventing release of H from a substrate.

The heat treatment method for high-temperature annealing is not particularly limited. Any method such as heater heating, lamp annealing or laser annealing can be applied. Heater heating and lamp annealing are desirable from the viewpoint of reducing process costs.

High-temperature annealing (first heat annealing) is desirable to be performed in an atmosphere containing H (hydrogen), D (deuterium) or He (helium) from the viewpoint of preventing falling of hydrogen from the surface of the n-type SiC layer 12. It is desirable to form, for example, a protective layer of graphite (graphite cap layer) on the surface of the n-type SiC layer 12 before annealing for preventing evaporation of Si (silicon) into the atmosphere from the surface at the time of high-temperature annealing.

By this heat treatment, H (hydrogen) or D (deuterium) of the n-type SiC layer 12 is activated to enter the site of Si (silicon) of SiC structure, so that the surface of the n-type SiC layer 12 is metallized, leading to formation of the metallic SiC region 14.

Since C (carbon) is introduced in an excessive amount in the n-type SiC layer 12, H (hydrogen) or D (deuterium) in the n-type SiC layer 12 more easily enters the site of Si (silicon) than the site of C (carbon) of SiC structure.

Figure 4E:
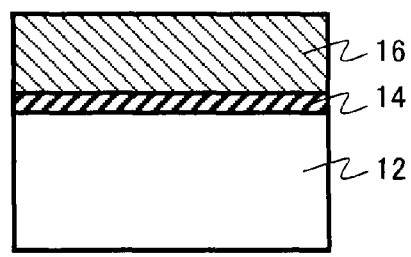

Next, the metal layer 16 is formed on the n-type SiC layer 12 (FIG. 4E).

Thereafter, it is desirable to perform low-temperature annealing (second heat treatment) at a temperature lower than that for the foregoing high-temperature annealing (first heat treatment). For example, low-temperature annealing (second heat treatment) is performed under conditions of a heating temperature of 400° C. or higher and 1000° C. or lower using as an atmospheric gas an inert gas such as an argon (Ar) gas.

The heat treatment method for low-temperature annealing is not particularly limited. Any method such as heater heating, lamp annealing or laser annealing can be applied. Heater heating and lamp annealing are desirable from the viewpoint of reducing process costs.

By the low-temperature annealing (second heat treatment), introduced H (hydrogen) or D (deuterium) is piled up to the inside of the SiC layer 14, particularly to an interface between the n-type SiC layer 12 and the SiC region 14 and an interface between the metal layer 16 and the SiC region 14. Consequently, metallization of the SiC region 14 further proceeds, so that the heights of the n-type SiC layer 12, the SiC region 14 and the barrier can be increased. Further, the contact resistance between the metal layer 16 and the SiC region 14 can be reduced.

By the above-mentioned production method, a semiconductor device having a structure shown in FIG. 1 is produced.

A second method for producing a semiconductor device according to this embodiment will now be described. FIGS. 5A to 5D are schematic sectional views of the semiconductor device in the process of production in the second method for producing a semiconductor device according to this embodiment.

A second method for producing a semiconductor device according to this embodiment includes subjecting a n-type SiC layer to a first heat treatment, evaporating at least a part of Si (silicon) in the vicinity of the surface of the n-type SiC layer, subjecting the n-type SiC layer to a second heat treatment at a temperature lower than that for the first heat treatment in an atmosphere containing hydrogen or deuterium, and forming a metal layer on the n-type SiC layer after the second heat treatment.

First, the n-type SiC layer 12 is provided (FIG. 5A) For example, the n-type SiC layer 12 is 4H—SiC having an impurity concentration of $1\times10^{15}$ cm$^{-3}$ or more and $1\times10^{18}$ cm$^{-3}$ or less and containing, for example, N (nitrogen) as a n-type impurity. For example, the n-type SiC layer 12 has a main surface having an off angle of 0 degree or more and 8 degrees or less with respect to the plane.

Figure 5A:
FIGS. 5A to 5D are schematic sectional views of the semiconductor device in the process of production in a second production method in the first embodiment.
Figure 5B:

Next, high-temperature annealing (first heat treatment) is performed (FIG. 5B). For example, high-temperature annealing is performed under conditions of a heating temperature of 1000° C. or higher and 1600° C. or lower and a heating time of 10 minutes or more and 60 minutes of less using an argon (Ar) gas atmosphere. For example, the heating temperature is 1200° C. Here, as an inert gas, Ar is used, but a $N_2$ gas, a He gas, a Ne gas or the like may be used. Particularly, the He gas has a small element radius, and therefore has an effect of preventing release of H from a substrate.

By the high-temperature annealing, Si (silicon) on the surface of the n-type SiC layer 12 is evaporated to form Si (silicon) defects. The heating temperature is desirable to be 1200° C. or lower from the viewpoint of avoiding excessive etching of the surface of the n-type SiC layer 12.

From the viewpoint of avoiding excessive etching of the surface of the n-type SiC layer 12, for example, high-temperature annealing can be performed in a reaction furnace with a solid Si (silicon) source added to the inner surface of a reaction chamber of a composite member of TaC (tantalum carbide)/Ta (tantalum). The solid Si (silicon) source is evaporated to bring the inside of the reaction furnace into a Si atmosphere, so that excessive etching of the surface of the n-type SiC layer 12 is suppressed. That is, by adjusting the Si atmosphere, the amount of silicon defects formed can be adjusted.

Figure 5C:
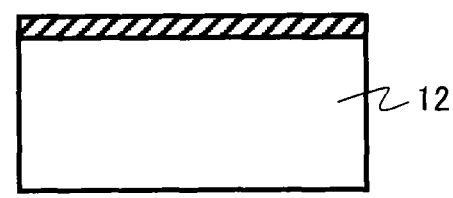

Next, first low-temperature annealing (second heat treatment) is performed at a temperature lower than that for high-temperature annealing (first heat treatment) (FIG. 5C). Low-temperature annealing is performed, for example, in an atmosphere containing H (hydrogen) or D (deuterium) like hydrogen annealing, deuterium annealing and the like. Low-temperature annealing may also be performed in a mixed atmosphere of a hydrogen gas or deuterium gas and an inert gas such as an argon gas.

For example, first low-temperature annealing is performed at a heating temperature of 400° C. or higher and 1200° C. or lower. For example, the heating temperature is 900° C. By the first low-temperature annealing, hydrogen is introduced into Si (silicon) defects formed by high-temperature annealing, i.e. the site of Si (silicon). Consequently, the surface of the n-type SiC layer 12 is metallized to form the metallic SiC region 14.

Figure 5D:
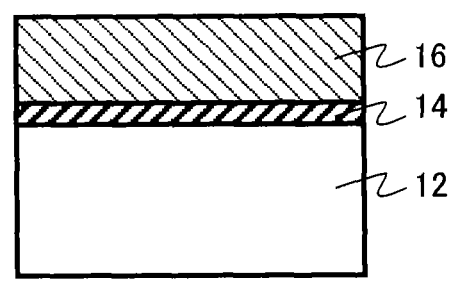

Next, the metal layer 16 is formed on the n-type SiC layer 12 (FIG. 5D).

Thereafter, it is desirable to perform second low-temperature annealing (third heat treatment) at a temperature lower than that for the foregoing high-temperature annealing (first heat treatment). For example, second low-temperature annealing (third heat treatment) is performed under conditions of a heating temperature of 400° C. or higher and 1000° C. or lower using as an atmospheric gas an inert gas such as an argon (Ar) gas.

By the second low-temperature annealing (third heat treatment), introduced hydrogen is piled up to the inside of the SiC region 14, particularly to an interface between the n-type SiC layer 12 and the SiC region 14 and an interface between the metal layer 16 and the SiC region 14. Consequently, metallization of the SIC region 14 further proceeds, so that the heights of the n-type SiC layer 12, the SiC region 14 and the barrier can be increased. Further, the contact resistance between the metal layer 16 and the SiC region 14 can be reduced.

When the surface of the n-type SiC layer 12 is provided with a region on which the SiC region 14 is not formed, for example, the region should be provided with a protective layer of graphite before high-temperature annealing.

It is also possible to perform first low-temperature annealing (second heat treatment) by a hydrogen plasma treatment or deuterium plasma treatment for introducing hydrogen into Si (silicon) defects formed by high-temperature annealing, i.e. the site of Si (silicon). In other words, the atmosphere containing H (hydrogen) or D (deuterium) in first low-temperature annealing (second heat treatment) is plasma H or plasma D. In this case, first low-temperature annealing (second heat treatment) is performed at 0° C. or higher and 1000° C. or lower.

It is also possible to perform evaporation of Si (silicon) and introduction of H (hydrogen) or D (deuterium) into the Si site in parallel by omitting first low-temperature annealing and performing only high-temperature annealing in a hydrogen-containing atmosphere. It is also possible to perform high-temperature annealing and first low-temperature annealing as a continuous heat treatment.

By the above-mentioned production method, a semiconductor device having a structure shown in FIG. 1 is produced.

Thus, according to this embodiment, a Schottky contact having a high barrier can be provided between a n-type SiC layer and a metal layer by providing a metallic SiC region.

Second Embodiment

A semiconductor device of this embodiment includes a p-type SiC layer; a SiC region provided on the p-type SiC layer, containing H (hydrogen) or D (deuterium) in an amount of $1 \times 10^{18}$ cm$^{-3}$ or more and $1 \times 10^{22}$ cm$^{-3}$ or less and having H (hydrogen) or D (deuterium) positioned at the C (carbon) site of SiC structure; and a metal layer provided on the SiC region.

Figure 6:
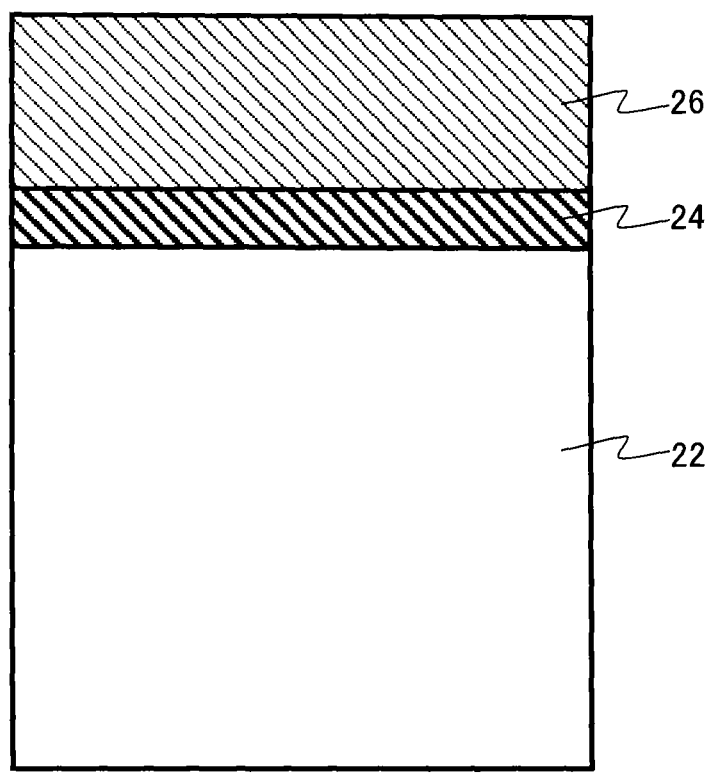
FIG. 6 is a schematic sectional view of a semiconductor device of a second embodiment.

FIG. 6 is a schematic sectional view of the semiconductor device of this embodiment. FIG. 6 shows a contact structure between a p-type SiC semiconductor and a metal. A SiC region 24 is provided on a p-type SiC layer 22, and a metal layer 26 is provided on the SiC region 24.

For example, the p-type SiC layer 22 is a SiC substrate of 4H—SiC, which has an impurity concentration of $1 \times 10^{15}$ cm$^{-3}$ or more and $1 \times 10^{18}$ cm$^{-3}$ or less and contains, for example, Al (aluminum) as a p-type impurity. For example, the p-type SiC layer 22 has a main surface having an off angle of 0 degree or more and 8 degrees or less with respect to the plane.

The SiC region 24 contains H (hydrogen) or D (deuterium) in an amount of $1 \times 10^{18}$ cm$^{-3}$ or more and $1 \times 10^{22}$ cm$^{-3}$ or less. The content of hydrogen in SiC region can be measured by, for example, SIMS (secondary ion mass spectrometry). The content of hydrogen is, for example, $1 \times 10^{12}$ cm$^{-2}$ or more and $1 \times 10^{16}$ cm$^{-2}$ or less in terms of a surface density.

The SiC region 24 is metal. That is, it is metallized SiC. The work function of the SiC region 24 is desirable to be 4.0 eV or less from the viewpoint of ensuring that the contact between the p-type SiC layer 22 and the metal layer 26 is made to be a Schottky contact having a high barrier.

H (hydrogen) or D (deuterium) in the SiC region 24 is positioned at the C (carbon) site of SiC structure. For example, 80% or more of hydrogen in the SiC region 24 is positioned at the C (carbon) site of SiC structure. Whether or not hydrogen in the SiC region 24 is positioned at the C (carbon) site of SiC structure can be determined by measurement by, for example, XPS (X-ray photoelectron spectroscopy).

The film thickness of the SiC region 24 is, for example, 1 nm or more and 1 μm or less.

The material that forms the metal layer 26 is not particularly limited. Examples of the material that forms the metal layer 26 include TiN (titanium nitride), W (tungsten), polycrystalline silicon, Al (aluminum), Ti (titanium), Cu (copper), Ni (nickel), Pt (platinum) and Au (gold).

The function and effect of this embodiment will be described below.

As a result of studies from first principle calculation by the present inventors, it has become evident that when hydrogen enters the site of C (carbon) of SiC structure, SiC is metallized. Further, according to first principle calculation, it has become evident that the work function is almost equal to 3.60 eV, a potential energy measured from the vacuum state at the lower end of the conduction band of SiC. Specifically, the work function is 4.0 eV or less, for example 3.89 eV.

FIGS. 7A, 7B, 8A and 8B are views for explaining the function of the semiconductor device of this embodiment.

Figure 7A:
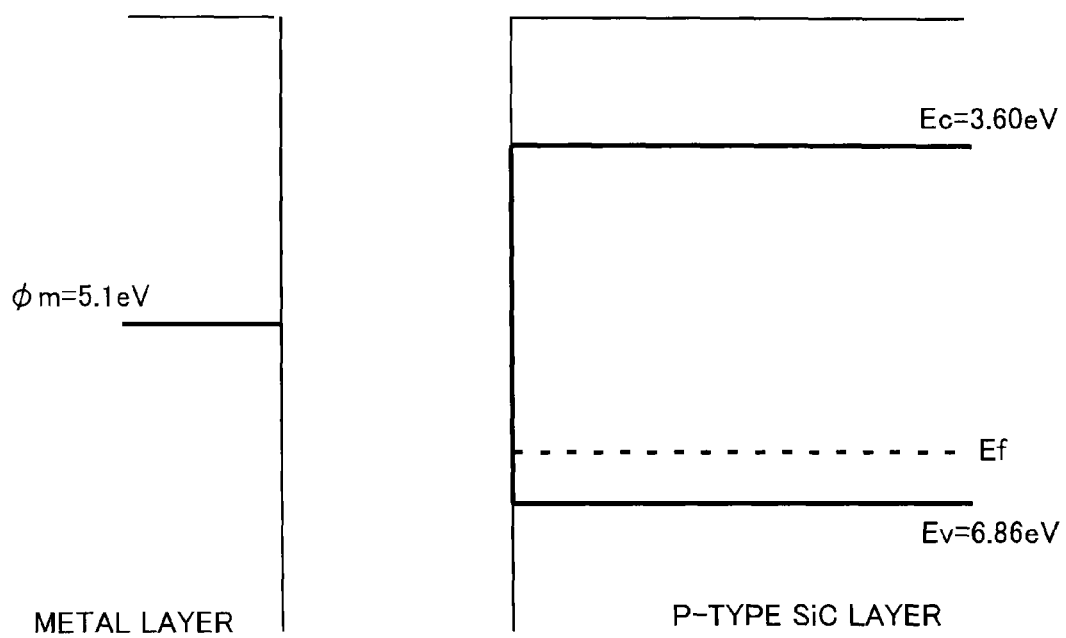
FIGS. 7A and 7B are views for explaining the function of the semiconductor device of the second embodiment.
Figure 7B:
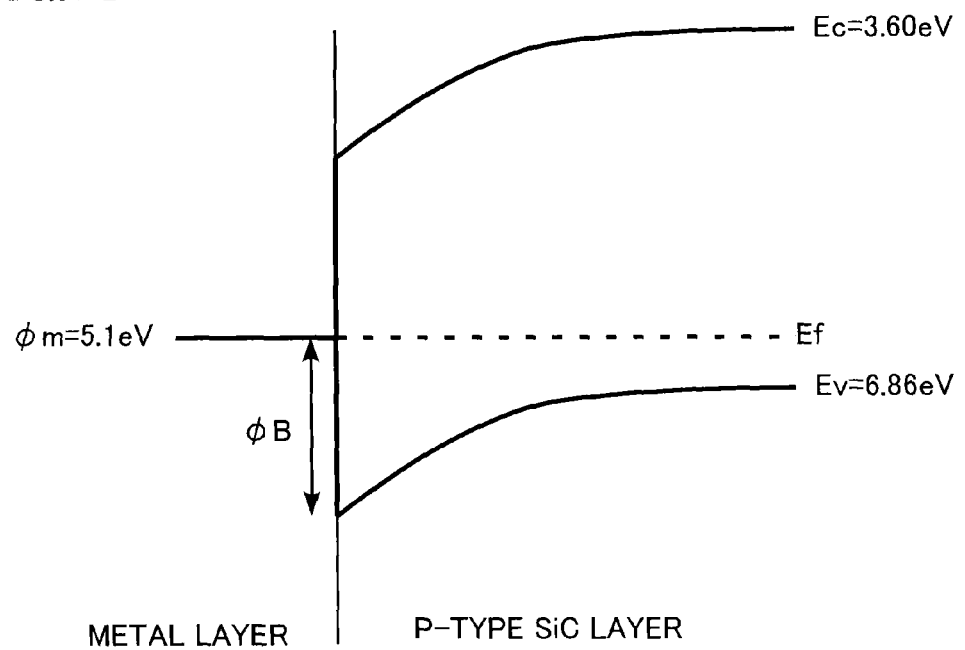
Figure 8A:
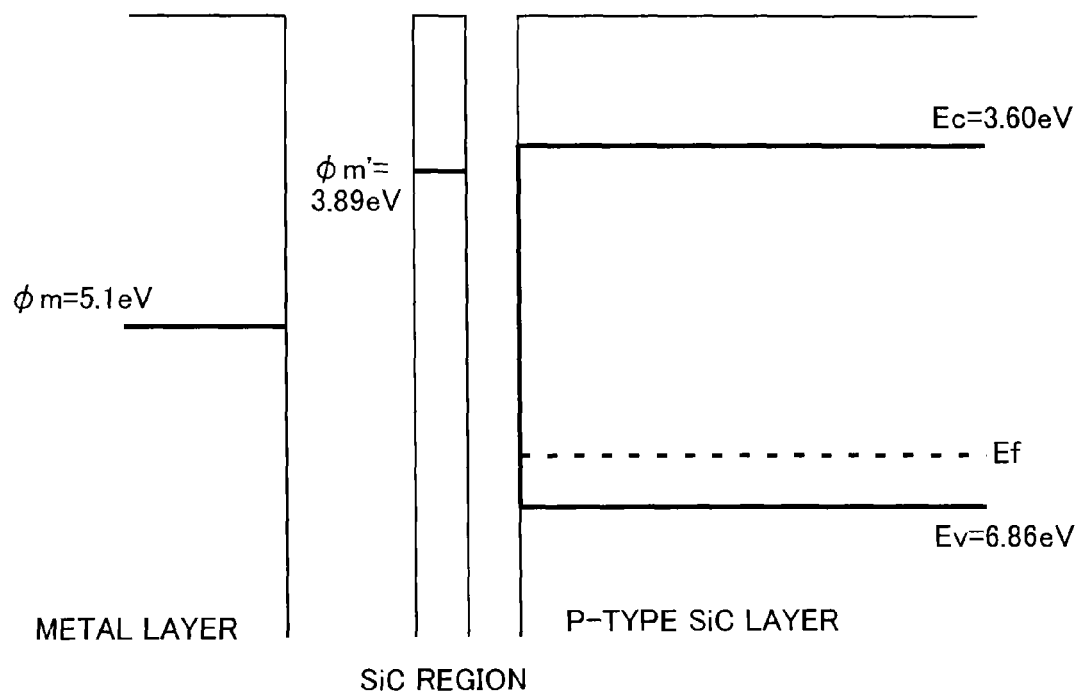
FIGS. 8A and 8B are views for explaining the function of the semiconductor device of the second embodiment.
Figure 8B:
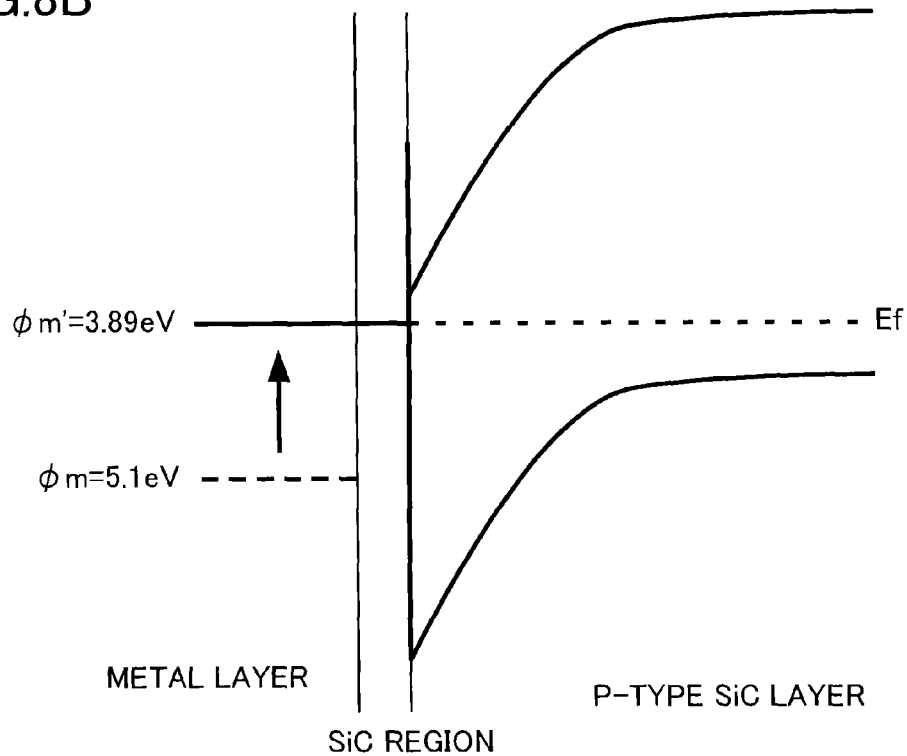

FIGS. 7A and 7B are band diagrams of a contact between the p-type SiC layer 22 and the metal layer 26 when the SiC region 24 is absent. FIGS. 8A and 8B are band diagrams of a contact between the p-type SiC layer 22 and the metal layer 26 when the SiC region 24 is present. FIGS. 7A and 8A are band diagrams before the p-type SiC layer 22 and the metal layer 26 come into contact with each other, and FIGS. 7B and 8B are band diagrams after the p-type SiC layer 22 and the metal layer 26 come into contact with each other.

In all of FIGS. 7A, 7B, 8A and 8B, a metal having a work function ($\phi$m) in the vicinity of a mid gap of SiC is assumed as the metal layer 26. Specifically, the metal is Ni (nickel) having a work function ($\phi$m) of 5.1 eV.

As shown in FIG. 7A, the p-type SiC layer 22 has a potential energy (Ev) of 6.86 eV at the upper end of the valence band and a potential energy (Ec) of 3.60 eV at the lower end of conduction band. In the p-type SiC layer 22, the fermi level (Ef) is at a position close to the upper end of the valence band.

As shown in FIG. 7B, when the p-type SiC layer 22 and the metal layer 26 come into contact with each other, the contact between the p-type SiC layer 22 and the metal layer 26 becomes a Schottky contact in which a Schottky barrier ($\phi$B) exists.

Among metal materials applicable in the semiconductor process, there is no suitable material having a work function close to a work function in the vicinity of a potential energy (Ev) at the lower end of the conduction band of SiC. Therefore, it is difficult for the contact between the p-type SiC layer 22 and the metal layer 26 to be a Schottky contact having a high barrier.

As shown in FIG. 8A, the metallic SiC region 24 in this embodiment has a work function ($\phi$m') in the vicinity of a potential energy (Ec) at the lower end of the conduction band of SiC. Specifically, the work function is 4.0 eV or less, and for example, $\phi$m' is 3.89 eV.

FIG. 8B shows a case where the p-type SiC layer 22 and the metal layer 26 are in contact with each other with the SiC region 24 interposed therebetween. In this case, there is a high Schottky barrier between the p-type SiC layer 22 and the SiC region 24. Between the SiC region 24 and the metal layer 26, the SiC region 24 serves as a pinning site, so that the work function of the metal layer 26 decreases to apparently 3.89 eV. Therefore, the barrier between the p-type SiC layer 22 and the metal layer 26 becomes extremely high, so that the contact between the p-type SiC layer 22 and the metal layer 26 can be made to be a Schottky contact having a high barrier.

According to the semiconductor device of this embodiment, the SiC region 24 having a work function in the vicinity of the upper end of the conduction band in the p-type SiC layer 22 serves as a pinning site to provide a Schottky contact having a high barrier between the p-type SiC layer 22 and the metal layer 26. At this time, the Schottky barrier no longer depends on a work function of the material that forms the metal layer 26. Therefore, in formation of a contact structure between the p-type SiC layer 22 and the metal layer 26, an optimum material can be selected not in consideration of the height of the Schottky barrier but from the viewpoint of other device properties or a production process.

As described above, the SiC region 24 contains H (hydrogen) in an amount of $1 \times 10^{18}$ cm$^{-3}$ or more and $1 \times 10^{22}$ cm$^{-3}$ or less in terms of a volume density. The content of H (hydrogen) in the SiC region 24 is desirable to be $1 \times 10^{19}$ cm$^{-3}$ or more and $1 \times 10^{21}$ cm$^{-3}$ or less. The content of hydrogen is desirable to be, for example, $1 \times 10^{13}$ cm$^{-2}$ or more and $1 \times 10^{15}$ cm$^{-2}$ or less in terms of a surface density. When the content of hydrogen falls below the above-mentioned range, metallization may be insufficient. When the content of hydrogen falls above the above-mentioned range, strain of crystals may increase.

The film thickness of the SiC region 24 is desirable to be, for example, 1 nm or more and 1 µm or less, and desirable to be 2 nm or more and 500 nm or less. When the film thickness of the SiC region 14 falls below the above-mentioned range, the pinning effect may be insufficient. When the film thickness of the SiC region 14 falls above the above-mentioned range, it may be difficult to secure stability in terms of a production process.

In this embodiment, the resistance between the SiC region 24 and the metal layer 26 is low without depending on a work function of the material that forms the metal layer 26.

In the case of a contact between a n-type SiC layer and a metal layer with the SiC region 24 interposed therebetween unlike this embodiment, the barrier between the n-type SiC layer and the metal layer becomes extremely small, so that the contact between the n-type SiC layer and the metal layer can be made to be an ohmic contact irrespective of the work function of the metal layer.

A method for producing a semiconductor device according to this embodiment will now be described. FIGS. 9A to 9E are schematic sectional views of the semiconductor device in the process of production in the method for producing a semiconductor device according to this embodiment.

The method for producing a semiconductor device according to this embodiment includes ion-implanting H (hydrogen), or D (deuterium) and Si (silicon) into a p-type SiC layer, performing a first heat treatment after the ion implantation of H (hydrogen), or D (deuterium) and Si (silicon), and forming a metal layer on the SiC layer after the first heat treatment.

First, the p-type SiC layer 22 is provided (FIG. 9A) For example, the p-type SiC layer 22 is a SiC substrate of 4H—SiC, which has an impurity concentration of $1 \times 10^{15}$ cm$^{-3}$ or more and $1 \times 10^{18}$ cm$^{-3}$ or less and contains, for example, Al (aluminum) as a p-type impurity. For example, the p-type SiC layer 22 has a main surface having an off angle of 0 degree or more and 8 degrees or less with respect to the plane.

Figure 9A:
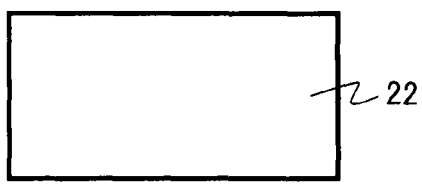
FIGS. 9A to 9E are schematic sectional views of the semiconductor device in the process of production in a production method in the second embodiment.
Figure 9B:
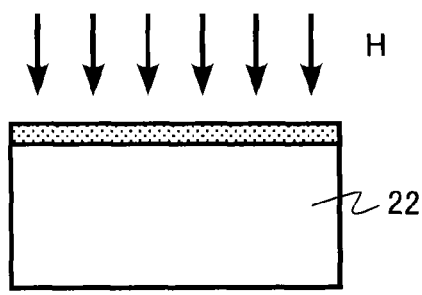

Next, H (hydrogen) or D (deuterium) is ion-implanted into the p-type SiC layer 22 (FIG. 9B). The dose amount of H (hydrogen) is, for example, $1 \times 10^{12}$ cm$^{-2}$ or more and $1 \times 10^{16}$ cm$^{-2}$ or less.

Figure 9C:
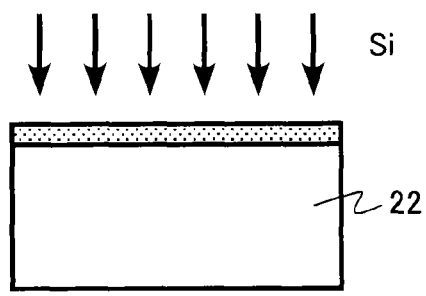

Next, Si (silicon) is ion-implanted into the p-type SiC layer 22 (FIG. 9C). The ion implantation is performed for generating defects of C (carbon) in the p-type SiC layer 22, and causing Si (silicon) to exist in an excessive amount, so that H (hydrogen) or D (deuterium) to be introduced into the p-type SiC layer 22 easily enters the site of C (carbon) of SiC structure. Of course, in the p-type SiC layer 22, intrinsic C (carbon) defects exist in a certain amount, and therefore ion implantation of Si (silicon) is not necessarily essential in formation of the metallic SiC region 24.

Figure 9D:
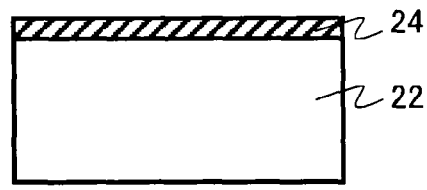

Next, high-temperature annealing (first heat treatment) for activating H (hydrogen) or D (deuterium) is performed (FIG. 9D). For example, high-temperature annealing is performed under conditions of a heating temperature of 400° C. or higher and 1600° C. or lower and a heating time of 10 minutes or more and 60 minutes of less using a mixed atmosphere of a hydrogen gas and an argon (Ar) gas.

The heat treatment method for high-temperature annealing is not particularly limited. Any method such as heater heating, lamp annealing or laser annealing can be applied. Heater heating and lamp annealing are desirable from the viewpoint of reducing process costs.

High-temperature annealing (first heat annealing) is desirable to be performed in an atmosphere containing H (hydrogen), D (deuterium) or He (helium) from the viewpoint of preventing falling of H (hydrogen) from the surface of the p-type SiC layer 22. It is desirable to form, for example, a protective layer of graphite (graphite cap layer) before annealing for preventing evaporation of Si (silicon) into the atmosphere from the surface at the time of high-temperature annealing.

By this heat treatment, H (hydrogen) of the p-type SiC layer 22 enters the site of C (carbon) of SiC structure, so that the surface of the p-type SiC layer 22 is metallized, leading to formation of the metallic SiC region 24.

Since Si (silicon) is introduced in an excessive amount in the p-type SiC layer 22, H (hydrogen) or D (deuterium) in the p-type SiC layer 22 more easily enters the site of C (carbon) than the site of Si (silicon) of SiC structure.

Figure 9E:
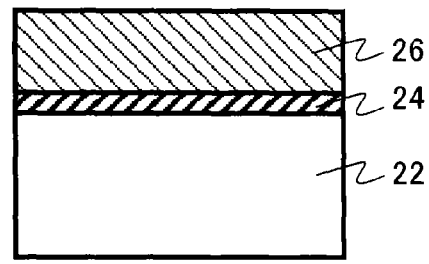

Next, the metal layer 26 is formed on the p-type SiC layer 22 (FIG. 9E).

Thereafter, it is desirable to perform low-temperature annealing (second heat treatment) at a temperature lower than that for the foregoing high-temperature annealing (first heat treatment). For example, low-temperature annealing (second heat treatment) is performed under conditions of a heating temperature of 400° C. or higher and 1000° C. or lower using as an atmospheric gas an inert gas such as an argon (Ar) gas.

The heat treatment method for low-temperature annealing is not particularly limited. Any method such as heater heating, lamp annealing or laser annealing can be applied. Heater heating and lamp annealing are desirable from the viewpoint of reducing process costs.

By the low-temperature annealing (second heat treatment), introduced H (hydrogen) is piled up to the inside of the SiC region 24, particularly to an interface between the p-type SiC layer 22 and the SiC region 24 and an interface between the metal layer 26 and the SiC region 24. Consequently, metallization of the SiC region 24 further proceeds, so that the heights of the p-type SiC layer 22, the SiC region 24 and the barrier can be increased. Further, the contact resistance between the metal layer 26 and the SiC region 24 can be reduced.

By the above-mentioned production method, a semiconductor device having a structure shown in FIG. 6 is produced.

Thus, according to this embodiment, a Schottky contact having a high barrier can be provided between a p-type SiC layer and a metal layer by a metallic SiC region.

Third Embodiment

A semiconductor device of this embodiment includes a semiconductor substrate; a n-type SiC layer provided on one side of the semiconductor substrate; a SiC region selectively provided on the n-type SiC layer and containing H (hydrogen) or D (deuterium) in an amount of $1\times10^{18}$ cm$^{-3}$ or more and $1\times10^{22}$ cm$^{-3}$ or less; an anode electrode provided on the surface of the n-type SiC layer and the surface of the SiC region; and a cathode electrode provided on the semiconductor substrate on a side opposite to the n-type SiC layer.

Figure 10:
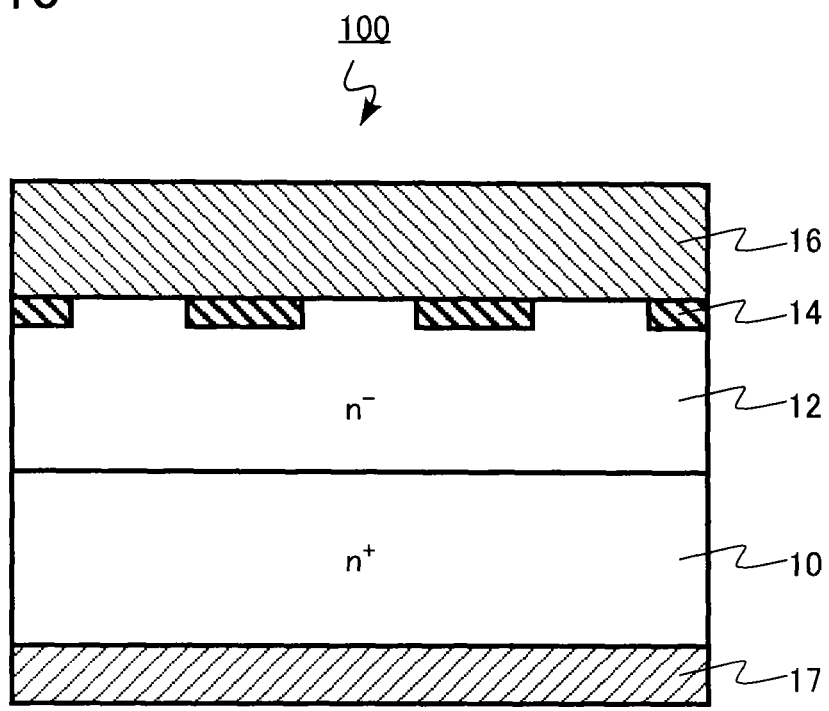
FIG. 10 is a schematic sectional view of a semiconductor device of a third embodiment.

FIG. 10 is a schematic sectional view of the semiconductor device of this embodiment. The semiconductor device 100 of this embodiment is a Schottky barrier diode (SBD), so called a double Schottky barrier diode (DSBD), which has two Schottky contacts having different barrier heights between a n-type SiC layer and an anode electrode.

In the DSBD 100 of this embodiment, a part of the contact structure between the n-type SiC layer and the anode electrode includes the contact structure shown in the first embodiment. Accordingly, descriptions of matters that overlap those in the first embodiment are omitted.

The DSBD 100 includes a n$^+$-type semiconductor SiC substrate (semiconductor substrate) 10. For example, the SiC substrate 10 is a SiC substrate of 4H—SiC, which has an impurity concentration of $1\times10^{18}$ cm$^{-3}$ or more and $1\times10^{20}$ cm$^{-3}$ or less and contains, for example, N (nitrogen) as a n-type impurity.

For example, a n$^-$-type SiC layer (drift layer: n-type SiC layer) 12 having a n-type impurity with an impurity concentration of $5\times10^{15}$ cm$^{-3}$ or more and $2\times10^{16}$ cm$^{-3}$ or less is formed on the SiC substrate 10. The film thickness of the drift layer 12 is, for example, 5 μm or more and 50 μm or less.

For example, a SiC region 14 containing H (hydrogen) or D (deuterium) in an amount of $1\times10^{18}$ cm$^{-3}$ or more and $1\times10^{22}$ cm$^{-3}$ or less is selectively provided on a part of the surface of the drift layer 12.

The SiC region 14 is metal. That is, it is metallized SiC. The work function of the SiC region 14 is desirable to be 6.0 eV or more from the viewpoint of ensuring that the contact between the n-type SiC layer 12 and the metal layer 16 is made to be a Schottky contact having a high barrier.

Hydrogen in the SiC region 14 is positioned at the Si (silicon) site of SiC structure. For example, 80% or more of hydrogen in the SiC region 14 is positioned at the Si (silicon) site of SiC structure. Whether or not hydrogen in the SiC region 14 is positioned at the Si (silicon) site of SiC structure can be determined by measurement by, for example, XPS (X-ray photoelectron spectroscopy).

The film thickness of the SiC region 14 is, for example, 1 nm or more and 50 μm or less.

An anode electrode (metal layer) 16 is provided on the surface of the drift layer 12 and the surface of the SiC region 14. The material that forms the anode electrode (metal layer) 16 is not particularly limited. Examples of the material that forms the metal layer 16 include TiN (titanium nitride), W (tungsten), polycrystalline silicon, Al (aluminum), Ti (titanium), Mo (molybdenum), Cu (copper), Ni (nickel), Pt (platinum) and Au (gold).

A cathode electrode 17 is provided on the SiC substrate 10 on a side opposite to the drift layer 12.

The function and effect of the DSBD 100 of this embodiment will be described below.

In the DSBD 100 of this embodiment, a Schottky barrier between the drift layer 12 and the anode electrode 16 that is in direct contact with the drift layer 12 is lower than a Schottky barrier between the drift layer 12 and the anode electrode 16 that is in contact with the drift layer 12 with the SiC region 14 interposed therebetween. Hereinafter, the region with a low Schottky barrier in the former is referred to as a low barrier region, and the region with a high Schottky barrier in the latter is referred to as a high barrier region.

In the DSBD 100 of this embodiment, a current passes from the anode electrode 16 to the cathode electrode 17 through the low barrier region at the on-time which corresponds to forward biassing. Therefore, the on-current increases as the area ratio of the low barrier region to the surface of the drain layer 12 becomes higher, in other words the area ratio of the SiC region 14 becomes lower.

On the other hand, at the off-time which corresponds to reverse biassing, depletion layers extending from adjacent SiC regions 14 to the drift layer 12 overlap each other, so that the low barrier region is pinched off. Accordingly, the current path is closed to reduce a leak current. The extension of the depletion layer to the drift layer 12 increases as the barrier height in the high barrier region becomes greater.

According to the DSBD 100 of this embodiment, the barrier height of the high barrier region can be extremely increased by providing the SiC region 14. Accordingly, the extension of the depletion layer can be increased, and resultantly the width of the low barrier region can be increased. Therefore, the area ratio of the low barrier region to the surface of the drain layer 12 can be increased. Accordingly, the on-current can be increased.

In the DSBD 100 of this embodiment, the height of the barrier in the high barrier region does not depend on a metal material of the anode electrode 16. Therefore, a metal material can be selected according to a Schottky barrier height required for the low barrier region. For example, it is desirable to select Ti (titanium) or Mo (molybdenum) as a metal material.

A method for producing a semiconductor device according to this embodiment will now be described.

Figure 11:
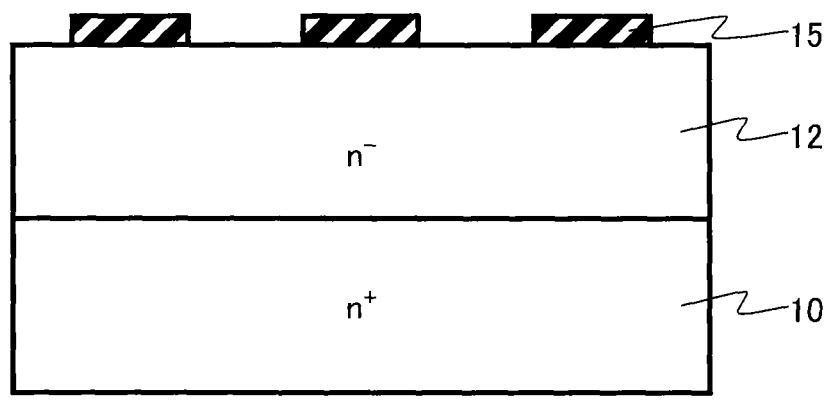
FIG. 11 is a schematic sectional view of the semiconductor device in the process of production in the production method in the third embodiment.
Figure 12:
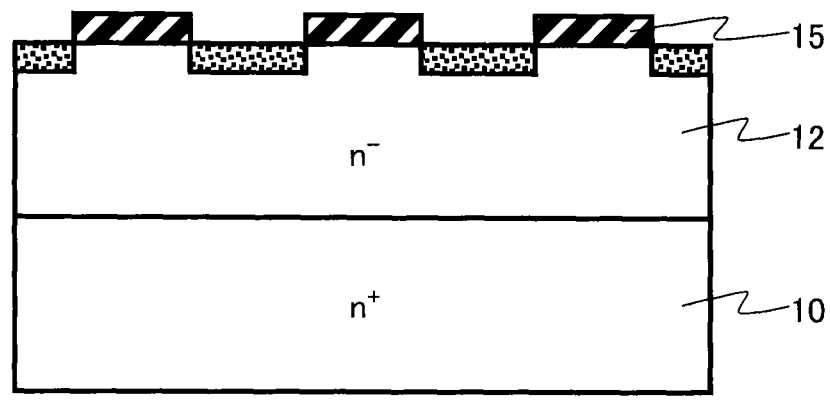
FIG. 12 is a schematic sectional view of the semiconductor device in the process of production in the production method in the third embodiment.
Figure 13:
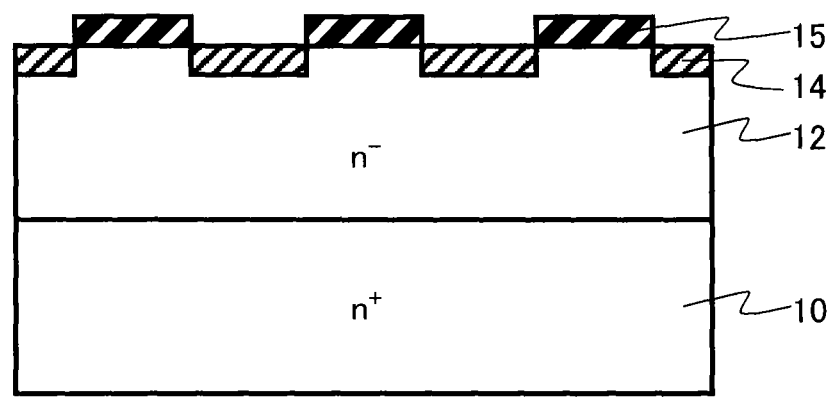
FIG. 13 is a schematic sectional view of the semiconductor device in the process of production in the production method in the third embodiment.

FIGS. 11 to 13 are schematic sectional views of the semiconductor device in the process of production in the method for producing a semiconductor device according to this embodiment.

First, the n$^+$-type SiC substrate 10 is provided. For example, the n$^+$-type SiC substrate 10 is a SiC substrate of 4H—SiC, which has an impurity concentration of $1 \times 10^{18}$ cm$^{-3}$ or more and $1 \times 10^{20}$ cm$^{-3}$ or less and contains, for example, N (nitrogen) as a n-type impurity.

Next, a high-resistance drift layer (n-type SiC layer) 12 containing, for example, N as a n-type impurity with an impurity concentration of about $1 \times 10^{16}$ cm$^{-3}$ and having a thickness of about 10 μm is epitaxially grown on one surface of the SiC substrate 10 using an epitaxial growth method.

Next, a graphite mask (graphite cap layer) 15 is selectively formed on a region other than the region where the SiC region 14 is formed later (FIG. 11).

Next, high-temperature annealing (first heat treatment) is performed (FIG. 12). For example, high-temperature annealing is performed under conditions of a heating temperature of 1000° C. or higher and 1600° C. or lower and a heating time of 10 minutes or more and 60 minutes of less using an argon (Ar) gas atmosphere.

By the high-temperature annealing, Si (silicon) on the surface of the drift layer 12 is evaporated to form Si (silicon) defects. The heating temperature is desirable to be 1200° C. or lower from the viewpoint of avoiding excessive etching of the surface of the drift layer 12.

Next, first low-temperature annealing (second heat treatment) is performed at a temperature lower than that for high-temperature annealing (first heat treatment) (FIG. 13). Low-temperature annealing is performed, for example, in an atmosphere containing H (hydrogen) like hydrogen annealing, deuterium annealing and the like. Low-temperature annealing may also be performed in a mixed atmosphere of a hydrogen gas or deuterium gas and an inert gas such as an argon gas.

For example, first low-temperature annealing is performed at a heating temperature of 400° C. or higher and 1200° C. or lower. For example, the heating temperature is 900° C. By the low-temperature annealing, hydrogen is introduced into Si (silicon) defects formed by high-temperature annealing, i.e. the site of Si (silicon). Consequently, a surface of the drift layer 12, which is not covered with the graphite mask 15, is metallized to form the metallic SiC region 14.

Thereafter, an anode electrode (metal layer) 16 is formed on the drift layer 12. A cathode electrode 17 is formed on the SiC substrate 10 on a side opposite to the drift layer 12.

By the above-mentioned production method, the DSBD 100 shown in FIG. 10 is formed.

Fourth Embodiment

A semiconductor device of this embodiment is similar to that of the third embodiment except that the semiconductor device has a mesa structure. Accordingly, descriptions of matters that overlap those in the third embodiment are omitted.

Figure 14:
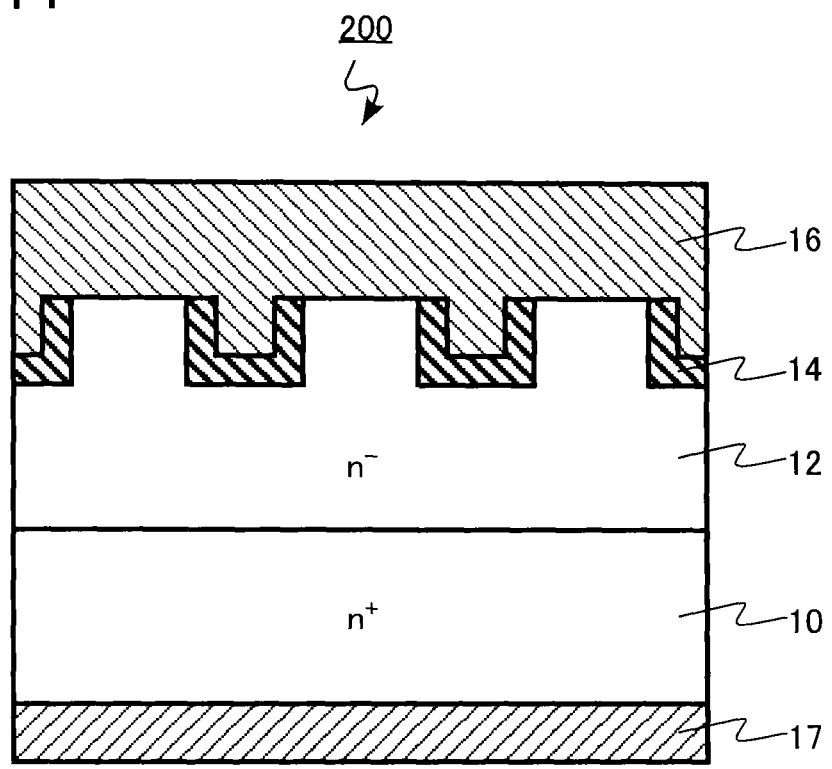
FIG. 14 is a schematic sectional view of a semiconductor device of a fourth embodiment.

FIG. 14 is a schematic sectional view of the semiconductor device of this embodiment. The semiconductor device 200 of this embodiment is a DSBD having two Schottky contacts having different barrier heights between a n-type SiC layer and an anode electrode.

As shown in FIG. 14, the DSBD 200 has a mesa structure. A SiC region 14 is formed in a groove formed on the surface of a drift layer 12. The anode electrode 16 and the drift layer 12 come into direct contact with each other at the surface of a raised portion of the drift layer 12, so that a low barrier region is formed. At the side surface of the raised portion of the drift layer 12, the anode electrode 16 and the drift layer 12 come into direct contact with each other with the SiC region 14 interposed therebetween, so that a high barrier region is formed.

According to this embodiment, depletion layers extend from both sides of the side surface of the raised portion of the drift layer 12 to pinch off the drift layer 12. Therefore, the leak current can be reduced more significantly as compared to the third embodiment. The width of the low barrier region can be further increased, so that the area ratio of the low barrier region to the surface of the drain layer 12 can be further increased. Accordingly, the on-current can be further increased.

Fifth Embodiment

A semiconductor device of this embodiment is similar to that of the third embodiment except that the depth of the SiC region 14 is great. Accordingly, descriptions of matters that overlap those in the third embodiment are omitted.

Figure 15:
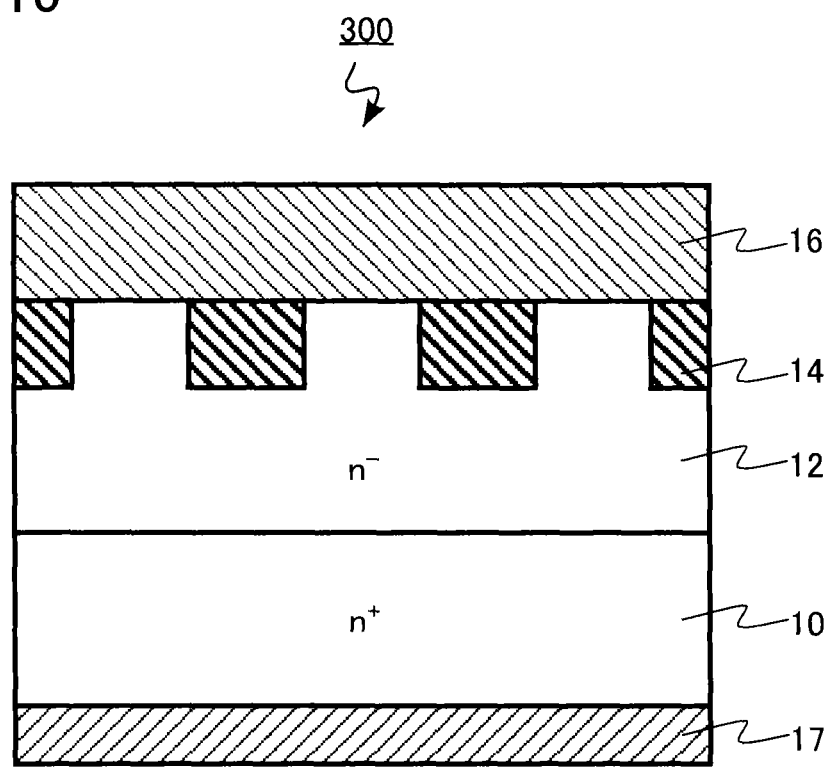
FIG. 15 is a schematic sectional view of a semiconductor device of a fifth embodiment.

FIG. 15 is a schematic sectional view of the semiconductor device of this embodiment. The semiconductor device 200 of this embodiment is a DSBD having two Schottky contacts having different barrier heights between a n-type SiC layer and an anode electrode.

As shown in FIG. 15, the DSBD 300 has a SiC region 14 deeper as compared to the third embodiment.

According to this embodiment, depletion layers extend from both sides of the side surface of the raised portion of the drift layer 12 to pinch off the drift layer 12. Therefore, the leak current can be reduced more significantly as compared to the third embodiment. The width of the low barrier region can be further increased, so that the area ratio of the low barrier region to the surface of the drain layer 12 can be further increased. Accordingly, the on-current can be further increased.

A method for producing a semiconductor device according to this embodiment will now be described.

Figure 16:
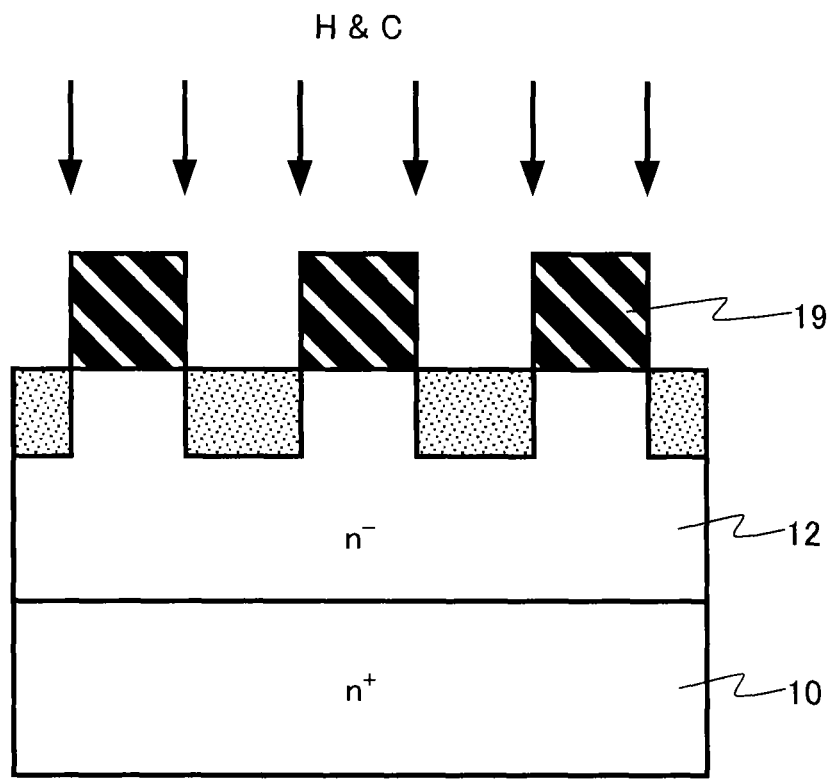
FIG. 16 is a schematic sectional view of the semiconductor device in the process of production in the production method in the fifth embodiment.
Figure 17:
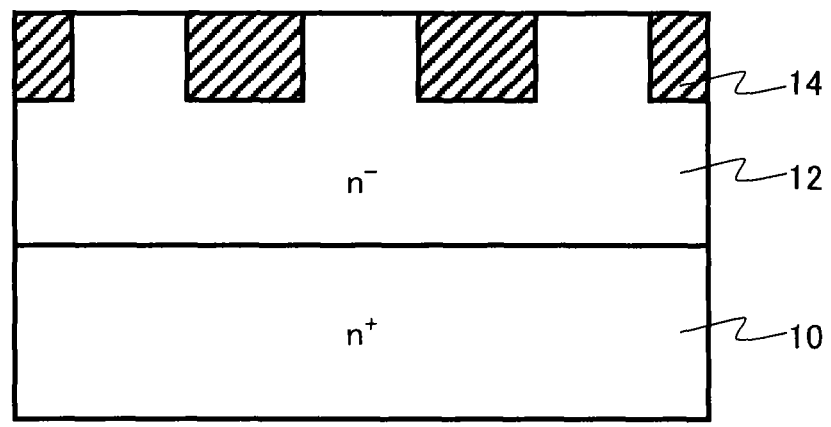
FIG. 17 is a schematic sectional view of the semiconductor device in the process of production in the production method in the fifth embodiment.

FIGS. 16 to 17 are schematic sectional views of the semiconductor device in the process of production in the method for producing a semiconductor device according to this embodiment.

First, the n$^+$-type SiC substrate 10 is provided. For example, the n$^+$-type SiC substrate 10 is a SiC substrate of 4H—SiC, which has an impurity concentration of $1\times10^{18}$ cm$^{-3}$ or more and $1\times10^{20}$ cm$^{-3}$ or less and contains, for example, N (nitrogen) as a n-type impurity.

Next, a high-resistance drift layer (n-type SiC layer) 12 containing, for example, N as a n-type impurity with an impurity concentration of about $1\times10^{16}$ cm$^{-3}$ and having a thickness of about 10 μm is epitaxially grown on one surface of the SiC substrate 10 using an epitaxial growth method.

Next, a resist mask 19 is selectively formed on a region other than the region where the SiC region 14 is formed later. H (hydrogen) or D (deuterium) is ion-implanted into the drift layer 12 (FIG. 16). The dose amount of H (hydrogen) or D (deuterium) is, for example, $1\times10^{12}$ cm$^{-2}$ or more and $1\times10^{16}$ cm$^{-2}$ or less.

Next, C (carbon) is ion-implanted into the drift layer 12 (FIG. 16). The ion implantation is performed for generating defects of Si (silicon) in the drift layer 12, and causing C (carbon) to exist in an excessive amount, so that H (hydrogen) or D (deuterium) to be introduced into the drift layer 12 easily enters the site of Si (silicon) of SiC structure.

Next, high-temperature annealing (first heat treatment) for activating H (hydrogen) or D (deuterium) is performed (FIG. 17). For example, high-temperature annealing is performed under conditions of a heating temperature of 400° C. or higher and 1600° C. or lower and a heating time of 10 minutes or more and 60 minutes of less using a mixed atmosphere of a hydrogen gas and an argon (Ar) gas.

The heat treatment method for high-temperature annealing is not particularly limited. Any method such as heater heating, lamp annealing or laser annealing can be applied. Heater heating and lamp annealing are desirable from the viewpoint of reducing process costs.

High-temperature annealing (first heat annealing) is desirable to be performed in an atmosphere containing H (hydrogen), D (deuterium) or He (helium) from the viewpoint of preventing falling of H (hydrogen) from the surface of the drift layer 12. It is desirable to form, for example, a protective layer of graphite before annealing for preventing evaporation of Si (silicon) into the atmosphere from the surface at the time of high annealing.

By this heat treatment, H (hydrogen) or D (deuterium) of the drift layer 12 enters the site of Si (silicon) of SiC structure, so that the surface of the n-type drift layer 12 is metallized, leading to formation of the metallic SiC region 14.

Since C (carbon) is introduced in an excessive amount in the drift layer 12, H (hydrogen) or D (deuterium) in the n-type SiC layer 12 more easily enters the site of Si (silicon) than the site of C (carbon) of SiC structure.

Thereafter, an anode electrode (metal layer) 16 is formed on the drift layer 12. A cathode electrode 17 is formed on the SiC substrate 10 on a side opposite to the drift layer 12.

By the above-mentioned production method, the DSBD 300 shown in FIG. 15 is formed. By introducing H (hydrogen) or D (deuterium) into the drift layer 12 by ion implantation, the SiC region 14 deeper as compared to the case of annealing in a hydrogen atmosphere can be formed.

Sixth Embodiment

Figure 18:
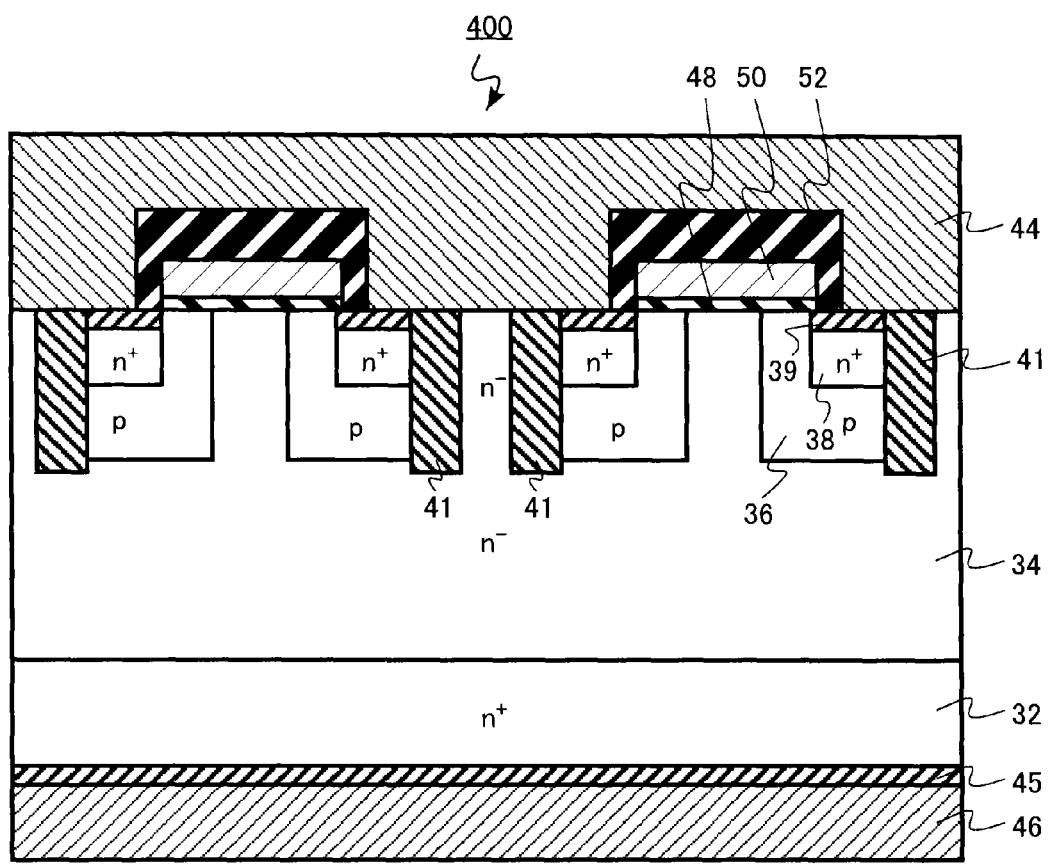
FIG. 18 is a schematic sectional view of a semiconductor device of a sixth embodiment.
Figure 19A:
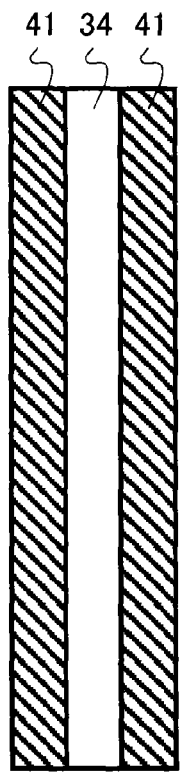
FIGS. 19A to 19E are plan views of a DSBD diode unit of the semiconductor device of the sixth embodiment.
Figure 19B:
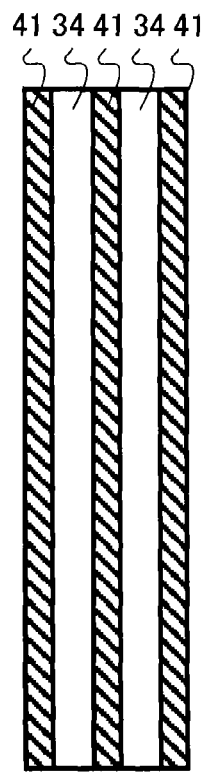
Figure 19C:
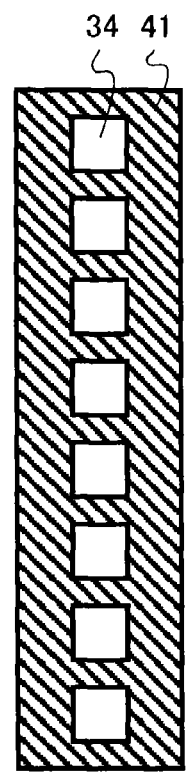
Figure 19D:
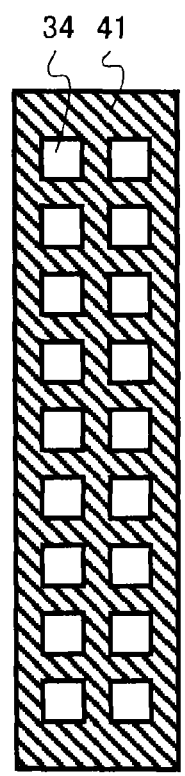
Figure 19E:
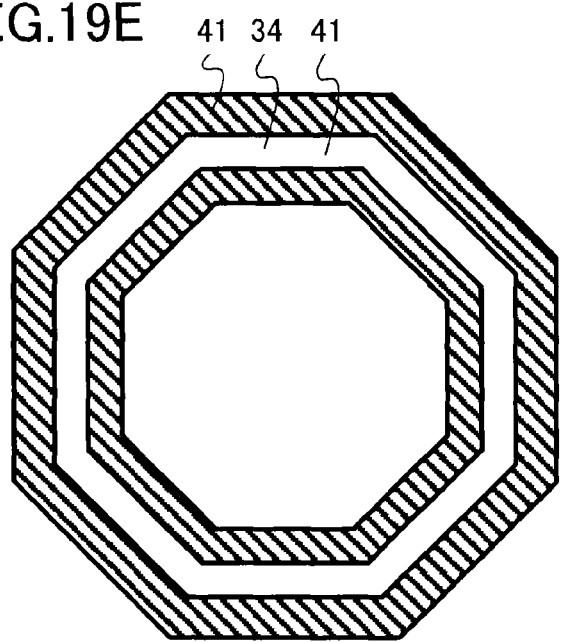

FIG. 18 is a schematic sectional view of the semiconductor device of this embodiment. This MOSFET (metal oxide semiconductor field effect transistor) 400 is, for example, a double implantation MOSFET (DIMOSFET) with a p-well and a source region formed by ion implantation. In FIG. 18, the first surface is a surface on the upper side in the figure, and the second surface is a surface on the lower side in the figure.

The MOSFET 400 of this embodiment includes a double Schottky barrier diode (DSBD) as a reflux diode. The included reflux diode has a structure similar to that in the fifth embodiment. Accordingly, descriptions of matters that overlap those in the fifth embodiment are omitted.

The MOSFET 400 includes a n$^+$-type semiconductor SiC substrate (semiconductor substrate) 32 having first and second surfaces. For example, the SiC substrate 32 is a SiC substrate of 4H—SiC, which has an impurity concentration of $1\times10^{18}$ cm$^{-3}$ or more and $1\times10^{20}$ cm$^{-3}$ or less and contains, for example, N (nitrogen) as a n-type impurity.

For example, a n$^-$-type SiC layer (drift layer) 34 having a n-type impurity with an impurity concentration of $5\times10^{15}$ cm$^{-3}$ or more and $2\times10^{16}$ cm$^{-3}$ or less is formed on the first surface of the SiC substrate 32. The film thickness of the drift layer 34 is, for example, 5 μm or more and 50 μm or less.

For example, a p-type first SiC region (p-well region) 36 having a p-type impurity with an impurity concentration of $5\times10^{15}$ cm$^{-3}$ or more and $1\times10^{17}$ cm$^{-3}$ or less is formed on the surface of a part of the drift layer 34. The p-type first SiC region (p-well region) 36 is in contact with the drift layer 34.

The depth of the p-well region 36 is, for example, about 0.6 μm or less. The p-well region 36 serves as a channel region of the MOSFET 400.

For example, a n-type second SiC region (source region) 38 with an impurity concentration of $1\times10^{18}$ cm$^{-3}$ or more and $1\times10^{22}$ cm$^{-3}$ or less is formed on the surface of a part of the p-well region 36. The source region 38 is in contact with the p-well region 36. The depth of the source region 38 is smaller than the depth of the p-well region 36, and is, for example, about 0.3 μm.

A metal source region (fourth SiC region) 39 containing H (hydrogen) in an amount of $1\times10^{18}$ cm$^{-3}$ or more and $1\times10^{22}$ cm$^{-3}$ or less is provided on the surface of the n-type source region 38 on the n-type second SiC region (source region) 38. The metal source region 39 is metal. That is, it is metallized SiC. The work function of the metal source region 39 is desirable to be 4.0 eV or less from the viewpoint of ensuring that the contact between the n-type source region 38 and the source electrode 44 is made to be an ohmic contact.

Hydrogen in the metal source region 39 is positioned at the C (carbon) site of SiC structure. For example, 80% or more of hydrogen in the metal source region 39 is positioned at the C (carbon) site of SiC structure. Whether or not hydrogen in the metal source region 39 is positioned at the C (carbon) site of SiC structure can be determined by measurement by, for example, XPS (X-ray photoelectron spectroscopy).

The film thickness of the metal source region 39 is, for example, 1 nm or more and 10 nm or less.

A metal p-well contact region (fifth SiC region) 41, which contains H in an amount of $1\times10^{18}$ cm$^{-3}$ or more and $1\times10^{22}$ cm$^{-3}$ or less and is deeper than the p-well region 36, is formed on the side of the p-well region 36 and the source region 38.

The metal p-well contact region 41 is metal. That is, it is metallized SiC. The work function of the metal p-well contact region 41 is desirable to be 6.0 eV or more from the viewpoint of ensuring that the contact between the p-well region 36 and the source electrode 44 is made to be an ohmic contact. The work function of the metal p-well contact region 41 is desirable to be 6.0 eV or more from the viewpoint of increasing the height of the Schottky barrier between the drift layer 34 and the metal p-well contact region 41.

Hydrogen in the metal p-well contact region 41 is positioned at the Si (silicon) site of SiC structure. For example, 80% or more of hydrogen in the SiC region 14 is positioned at the Si (silicon) site of SiC structure. Whether or not hydrogen in the metal p-well contact region 41 is positioned at the Si (silicon) site of SiC structure can be determined by measurement by, for example, XPS (X-ray photoelectron spectroscopy).

Further, a region where a n$^-$-type SiC layer (drift layer) 34 and a source electrode 44 are in direct contact with each other is provided between two adjacent metal p-well contact regions 41.

The surfaces of the drift layer 34 and the p-well region 36 have a gate insulating film 48 continuously formed so as to stride over the layer and the region. The gate insulating film 48 is in contact with the drift layer 34 and the p-well region 36. For the gate insulating film 48, for example, a SiO$_2$ film or a high-k insulating film can be applied.

A gate electrode 50 is provided with the gate insulating film 48 interposed between the gate electrode 50 and the drift layer 34, the p-well region 36 and the source region 38. The gate electrode 50 is formed on the gate insulating film 38. For the gate electrode 50, for example, polysilicon etc. can be applied. An interlayer insulating film 52 formed of, for example, a SiO$_2$ film is formed on the gate electrode 50.

The p-well region 36 at an area sandwiched between the source region 38 and the drift layer 14 under the gate electrode serves as a channel region of the MOSFET 400.

A conductive source electrode (first electrode) 44 that is electrically connected to the metal source region 39 and the metal p-well contact region 41 is provided on the metal source region 39 and the metal p-well contact region 41. The source electrode 44 also serves as a p-well electrode that gives an electrical potential to the p-well region 36.

The source electrode 44 is, for example, Ti (titanium) or Mo (molybdenum).

A metal drain region (sixth SiC region) 45 containing H (hydrogen) in an amount of $1\times10^{18}$ cm$^{-3}$ or more and $1\times10^{22}$ cm$^{-3}$ or less is provided on the SiC substrate 32 on a side opposite to the drift layer 34, i.e. on the second surface side. The metal drain region 45 is metal. That is, it is metallized SiC. The work function of the metal drain region 45 is desirable to be 4.0 eV or less from the viewpoint of ensuring that the contact between the SiC substrate 32 and the drain electrode 46 is made to be an ohmic contact.

Hydrogen in the metal drain region 45 is positioned at the C (carbon) site of SiC structure. For example, 80% or more of hydrogen in the metal drain region 45 is positioned at the C (carbon) site of SiC structure. Whether or not hydrogen in the metal drain region 45 is positioned at the C (carbon) site of SiC structure can be determined by measurement by, for example, XPS (X-ray photoelectron spectroscopy).

The film thickness of the metal drain region 45 is, for example, 1 nm or more and 10 nm or less.

A conductive drain electrode (second electrode) 46 is formed on the surface of the metal drain region 45. The drain electrode 46 is electrically connected to the SiC substrate 32.

The drain electrode 46 is, for example, TiN (titanium nitride). The film thickness of the drain electrode 46 is, for example, 1 μm or more and 10 μm or less.

In this embodiment, the n-type impurity is, for example, preferably N (nitrogen) or P (phosphorus), but As (arsenic), Sb (antimony) or the like can also be applied. The p-type impurity is, for example, preferably Al (aluminum), but B (boron), Ga (gallium), In (indium) or the like can also be applied.

According to this embodiment, a metallic metal source region 39 containing H (hydrogen) is provided between the n-type source region 38 and the source electrode 44. The metal source region 39 has a work function in the vicinity of a potential energy (Ec) at the lower end of the conduction band of SiC. The work function of the metal material of the source electrode 44 is pinned to the metal source region 39. Therefore, the contact between the n-type source region 38 and the source electrode 44 can be made to be a low-resistance ohmic contact.

A metallic metal p-well contact region (not illustrated) containing H (hydrogen) is provided between a p-type p-well contact region (not illustrated) and the source electrode 44. Alternatively, the metal p-well contact region 41 is formed to a great depth as shown in the figure. The metal p-well contact region 41 has a work function in the vicinity of a potential energy (Ev) at the upper end of the valence band of SiC. The work function of the material of the source electrode 44 is pinned to the metal p-well contact region 41. Therefore, the contact between the p-type p-well region 36 and the source electrode 44 can be made to be a low-resistance ohmic contact. The contact between the metal p-well contact region 41 and the source electrode 44 can be made to be a low-resistance ohmic contact.

As described above, according to this embodiment, the contacts between the n-type source region 38 and metallic p-well contact region 41 (the same applies to a case where the metallic metal p-well contact region is inserted at the surface of the p-type p-well contact region) and the source electrode 44 can be each made to be a low-resistance ohmic contact using the same material. Therefore, the contacts between the n-type source region 38 and p-type p-well region 36 and the source electrode 44 can be easily formed in parallel.

Further, in this embodiment, a Schottky contact is established between the source electrode 44 and the n$^-$-type SiC layer (drift layer) 34. The source electrode 44, the drift layer 34, the two metal p-well contact regions 41 and the drain electrode 46 form a double Schottky diode (DSBD) included in the MOSFET 400. The DSBD serves as a reflux diode.

FIGS. 19A to 19E are plan views of the DSBD unit of the semiconductor device of this embodiment. Patterns of the drift layer 34 and the p-well contact region 41 are illustrated. In this embodiment, the same material can be applied for the material of the source electrode 44 that is in contact with the drift layer 34 and the p-well contact region 41. Therefore, as shown in FIGS. 19A to 19E, a variety of patterns can be selected in consideration of the properties of the DSBD etc., the degree of integration of the DSBD, and so on.

According to this embodiment, selection of a material that forms the source electrode 44 is free from limitations associated with reduction of contact resistance between the metal p-well contact region 41 and the metal source region 39. Alternatively, there is no limitation associated with the height of the Schottky barrier between the metal p-well contact region 41 and the drift layer 34.

Therefore, a metal material that forms the source electrode 44 can be selected from the viewpoint of ensuring that the Schottky contact between the source electrode 44 and the drift layer 34 has desired properties. From this viewpoint, the metal material that forms the source electrode 44 is desirable to be Ti (titanium) or Mo (molybdenum).

In this embodiment, the Schottky barrier between the drift layer 34 and the metal p-well contact region 41 is high. Therefore, the width of a depletion layer extending through the drift layer 34 between the two metal p-well contact regions 41 at the time of reverse biassing of the DSBD is large. Accordingly, the leak current at the time of reverse biassing is reduced.

According to the MOSFET 400 of this embodiment, a DSBD having excellent properties can be included as a reflux diode. Accordingly, in the circuit configuration, it is not necessary to provide a reflux diode as an element different from the MOSFET.

Modification

Figure 20:
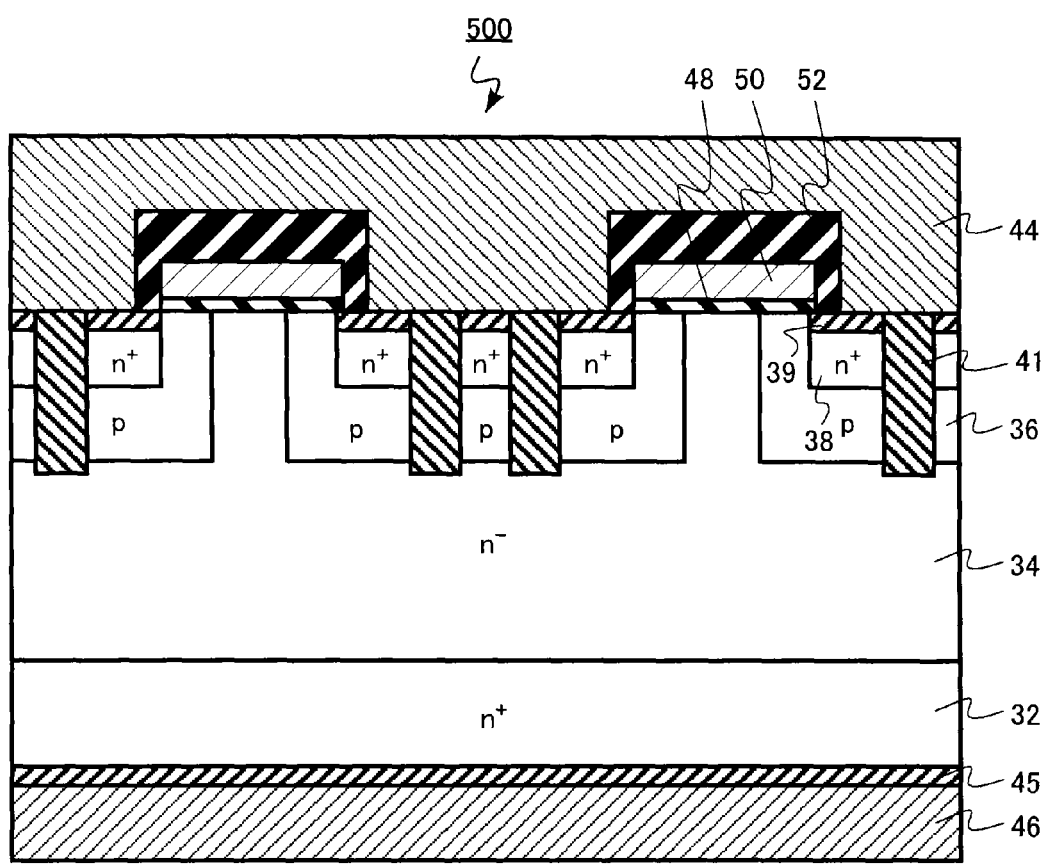
FIG. 20 is a schematic sectional view of a semiconductor device of a modification of the sixth embodiment.

FIG. 20 is a schematic sectional view of a semiconductor device in the modification of sixth embodiment. A MOSFET 500 of this modification is similar to that of the sixth embodiment except that a DSBD is of so called transparent type.

The MOSFET 500 of this modification has a n-type source region 38 and a metal source region 39 of the surface thereof between two metal p-well contact regions 41. When the thickness of a resist is controlled, the rising voltage can be controlled by, for example, deliberately reducing the thickness of the p-well region 36 only between p-well contact regions 40.

According to the MOSFET 500 of this embodiment, further a DSBD having excellent properties can be included as a reflux diode.

Seventh Embodiment

Figure 21:
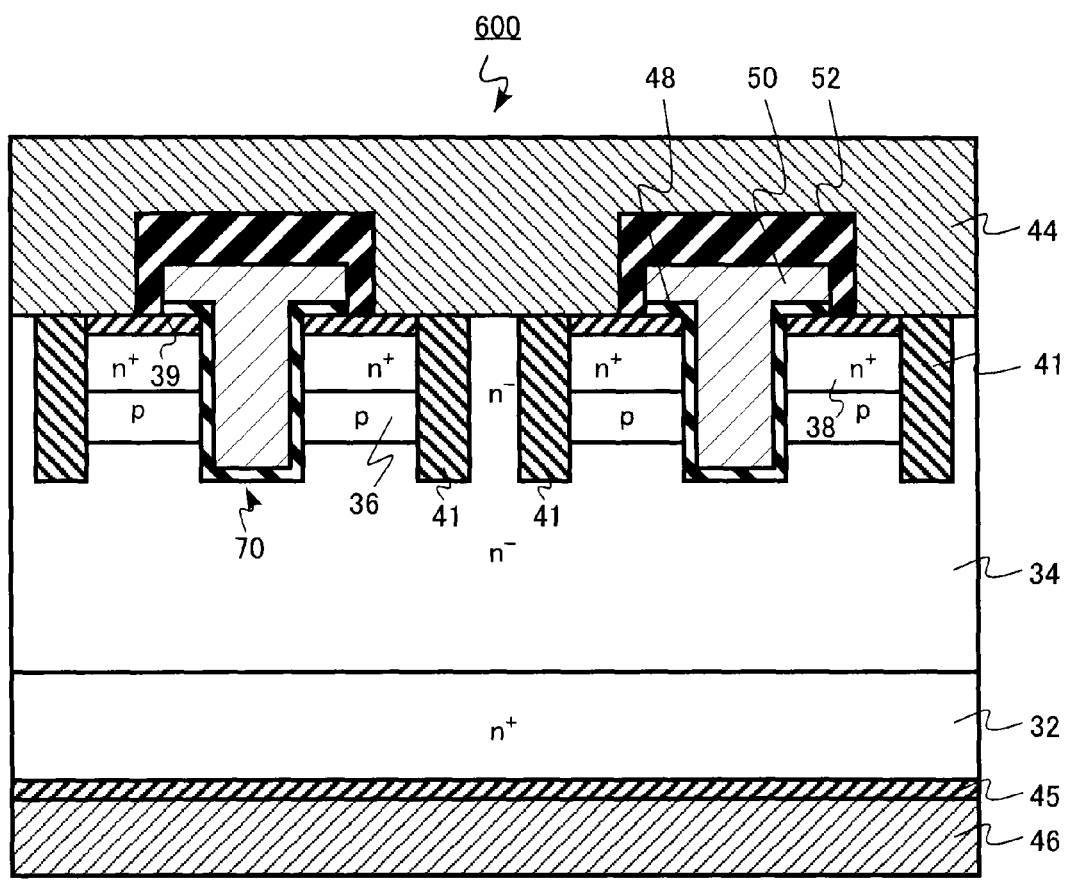
FIG. 21 is a schematic sectional view of a semiconductor device of a seventh embodiment.

FIG. 21 is a schematic sectional view of the semiconductor device of this embodiment. The MOSFET 600 is similar to that of the sixth embodiment except that it has a trench gate structure. Accordingly, descriptions of matters that overlap those in the sixth embodiment are omitted.

In the MOSFET 600 of this embodiment, the inside of a trench 70 provided in a drift layer 34 is provided with a gate electrode 50 with a gate insulating film 48 interposed therebetween. The degree of integration of the MOSFET 600 of this embodiment can be improved by employing a trench gate structure. This embodiment is similar to the sixth embodiment in that a DSBD having excellent properties is included as a reflux diode.

Eighth Embodiment

A semiconductor device of this embodiment includes a p-type SiC layer; a SiC region provided on the p-type SiC layer, containing H (hydrogen) in an amount of $1\times10^{18}$ cm$^{-3}$ or more and $1\times10^{22}$ cm$^{-3}$ or less and having H (hydrogen) positioned at the C (carbon) site of SiC structure; and a metal layer provided on the SiC region.

Figure 22:
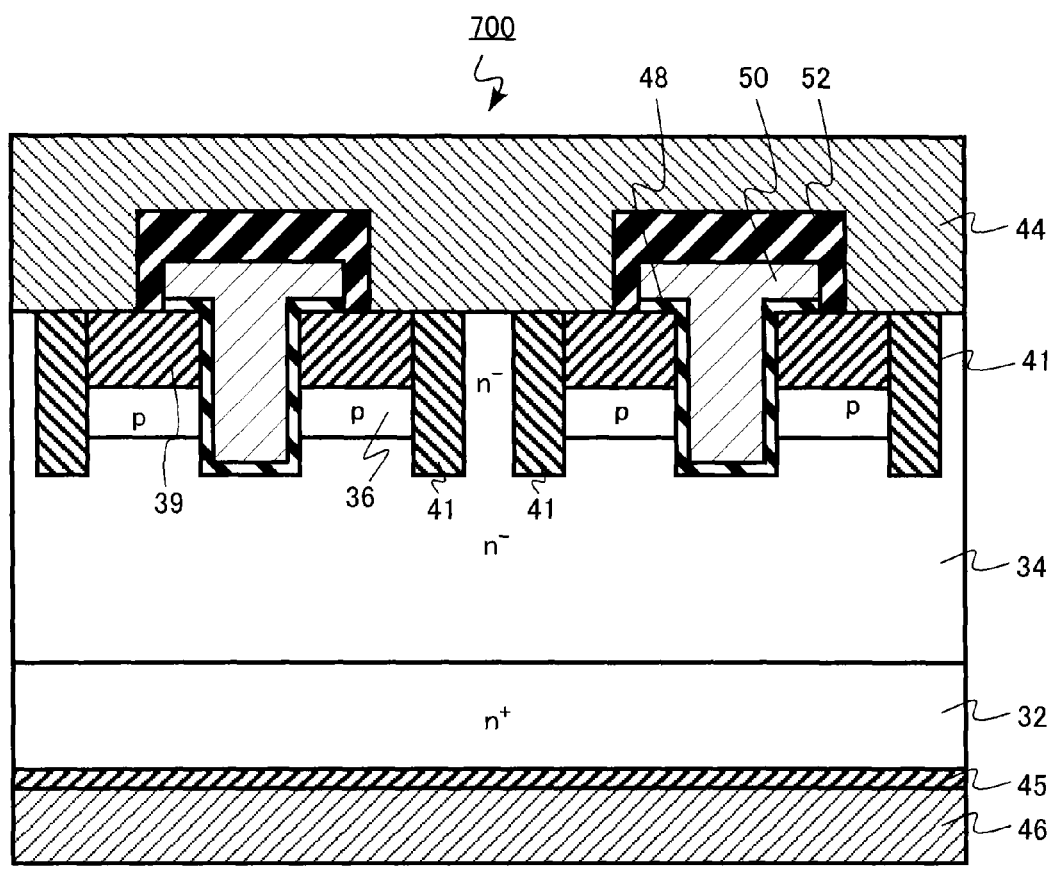
FIG. 22 is a schematic sectional view of a semiconductor device of an eighth embodiment.

FIG. 22 is a schematic sectional view of the semiconductor device of this embodiment. The MOSFET 700 is similar to that of the seventh embodiment except that there is no source region 38, and the metal source region (SiC region) 39 is in direct contact with the p-well region (p-type SiC layer) 36. Accordingly, descriptions of matters that overlap those in the seventh embodiment are omitted.

In the MOSFET 700 of this embodiment, the contact between the metal source region (SiC region) 39 and the p-well region (p-type SiC layer) 36 has a high Schottky barrier. When the MOSFET 700 is in the on-state, the barrier between the metal source region 39 and the p-well region 36 is absent, or extremely small. Accordingly, the MOSFET 700 having a small on-resistance is provided.

In the off-state, the energy barrier between the metal source region 39 and the p-well region 36 increases to 3.26 eV (electron volt). This value is equivalent to a band gap of SiC. Accordingly, the MOSFET 700 having an excellent cutoff property is provided.

Ninth Embodiment

Figure 23:
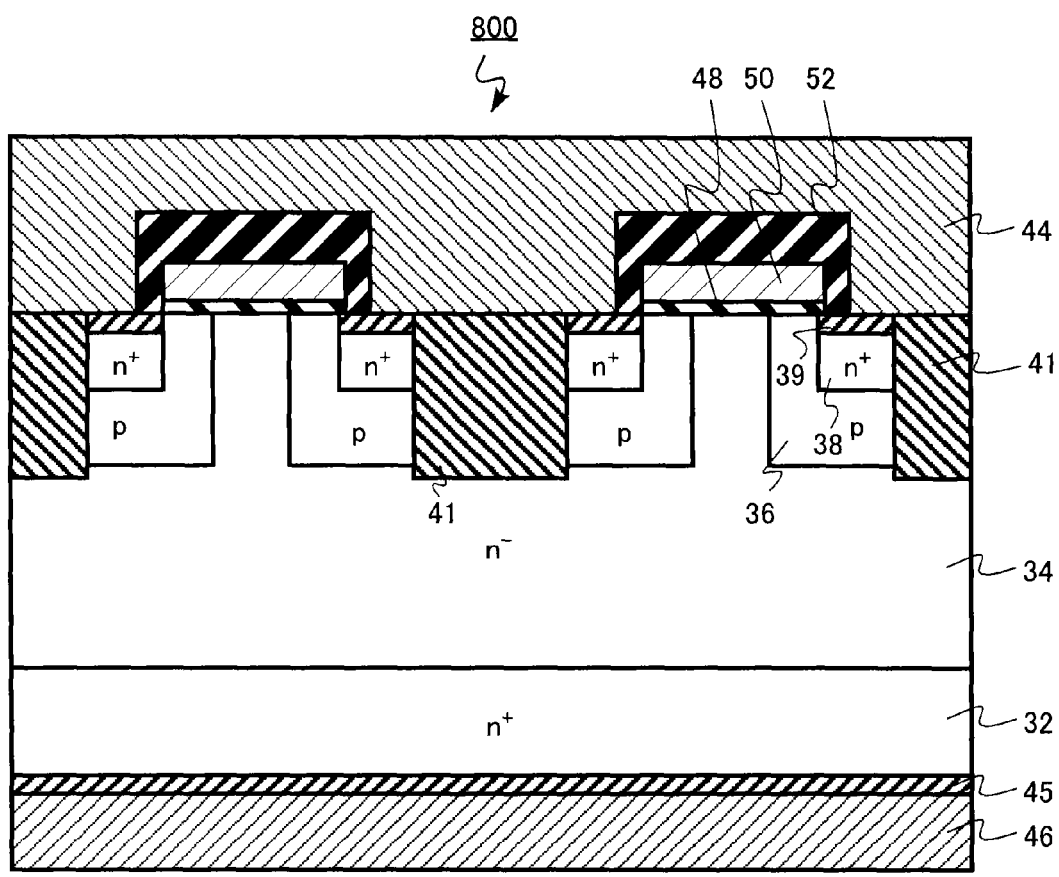
FIG. 23 is a schematic sectional view of a semiconductor device of a ninth embodiment.

FIG. 23 is a schematic sectional view of the semiconductor device of this embodiment. The MOSFET 800 is similar to that of the sixth embodiment except that the reflux diode is not a DSBD, and the p-well contact region 41 deeper than the p-well region 36 is used as an anode electrode.

According to the MOSFET 800 of this embodiment, the on-current and breakdown voltage of the reflux diode are improved. Accordingly, a MOSFET having excellent properties is provided.

Thus, in the embodiments, the crystal structure of silicon carbide has been described with the case of 4H—SiC as an example, but the present disclosure can be applied to silicon carbide having other crystal structures such as 6H—SiC and 3C—SiC. The main surface of the substrate has been described with the plane as an example, but the present disclosure can also be applied when the substrate has other plane orientations.

In the embodiments, the device structure has been described with a DSBD and MOSFET as an example, but the present disclosure can also be applied to other device structures.

While certain embodiments have been described, these embodiments have been presented by way of example only, and are not intended to limit the scope of the inventions. Indeed, a semiconductor device and a method for producing the same described herein may be embodied in a variety of other forms; furthermore, various omissions, substitutions, and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a n-type SiC layer;
    a SiC region provided on the n-type SiC layer, the SiC region containing H (hydrogen) or D (deuterium) in an amount of $1\times10^{18}$ cm$^{-3}$ or more and $1\times10^{22}$ cm$^{-3}$ or less, the H (hydrogen) or D (deuterium) being positioned at Si (silicon) site of SiC structure; and
    a metal layer provided on the SiC region.

2. The device according to claim 1, wherein the SiC region is metallic.

3. The device according to claim 1, wherein the work function of the SiC region is 6.0 eV or more.

4. The device according to claim 1, wherein the film thickness of the SiC region is 1 nm or more.

5. A semiconductor device comprising:
a p-type SiC layer;
a SiC region provided on the p-type SiC layer, the SiC region containing H (hydrogen) or D (deuterium) in an amount of $1 \times 10^{18}$ cm$^{-3}$ or more and $1 \times 10^{22}$ cm$^{-3}$ or less, the H (hydrogen) or D (deuterium) being positioned at the C (carbon) site of SiC structure; and
a metal layer provided on the SiC region.

6. The device according to claim 5, wherein the SiC region is metallic.

7. The device according to claim 5, wherein the work function of the SiC region is 4.0 eV or less.

8. The device according to claim 5, wherein the film thickness of the SiC region is 1 nm or more.

9. The device according to claim 1, wherein 80% or more of the H (hydrogen) or D (deuterium) is positioned at Si (silicon) site of SiC structure.

10. The device according to claim 1, wherein the metal layer comprises at least one member selected from the group consisting of TiN (titanium nitride), W (tungsten), polycrystalline silicon, Al (aluminum), Ti (titanium), Cu (copper), Ni (nickel), Pt (platinum) and Au (gold).

11. The device according to claim 5, wherein 80% or more of the H (hydrogen) or D (deuterium) is positioned at C (carbon) site of SiC structure.

12. The device according to claim 5, wherein the metal layer comprises at least one member selected from the group consisting of TiN (titanium nitride), W (tungsten), polycrystalline silicon, Al (aluminum), Ti (titanium), Cu (copper), Ni (nickel), Pt (platinum) and Au (gold).

13. A method for producing a semiconductor device according to claim 1, the method comprising:
subjecting a n-type SiC layer to a first heat treatment and evaporating at least a part of Si (silicon) in the vicinity of the surface of the SiC layer;
subjecting the SiC layer to a second heat treatment at a temperature lower than a temperature of the first heat treatment in an atmosphere containing H (hydrogen) or D (deuterium); and
forming a metal layer on the SiC layer after the second heat treatment.

14. The method according to claim 13, wherein after the forming of the metal layer, a third heat treatment is performed at a temperature lower than the temperature of the second heat treatment.

15. The method according to claim 13, wherein a metallic SiC region is formed on the surface of the SiC layer by the second heat treatment.

16. The method according to claim 13, wherein the first heat treatment is performed at 1000° C. or higher and 1600° C. or lower.

17. The method according to claim 13, wherein the second heat treatment is performed at 400° C. or higher and 1200° C. or lower.

18. The method according to claim 13, herein in the second heat treatment, the atmosphere containing H (hydrogen) or D (deuterium) is plasma H or plasma D, and the heat treatment temperature is 0° C. or higher and 1000° C. or lower.

19. The method according to claim 14, wherein the third heat treatment is performed at 400° C. or higher and 1000° C. or lower.

* * * * *